(12) United States Patent
Chandhok et al.

(10) Patent No.: US 11,887,887 B2
(45) Date of Patent: Jan. 30, 2024

(54) INTERCONNECT STRUCTURES AND METHODS OF FABRICATION

(71) Applicant: Intel Corporation, Santa Clara, CA (US)

(72) Inventors: Manish Chandhok, Beaverton, OR (US); Ramanan Chebiam, Hillsboro, OR (US); Brennen Mueller, Portland, OR (US); Colin Carver, Hillsboro, OR (US); Jeffery Bielefeld, Forest Grove, OR (US); Nafees Kabir, Portland, OR (US); Richard Vreeland, Beaverton, OR (US); William Brezinski, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/850,876

(22) Filed: Jun. 27, 2022

(65) Prior Publication Data

US 2022/0336267 A1 Oct. 20, 2022

Related U.S. Application Data

(63) Continuation of application No. 16/586,279, filed on Sep. 27, 2019, now Pat. No. 11,404,307.

(51) Int. Cl.
*H01L 23/528* (2006.01)
*H01L 21/768* (2006.01)
(Continued)

(52) U.S. Cl.
CPC .. *H01L 21/76801* (2013.01); *H01L 21/76822* (2013.01); *H01L 21/76826* (2013.01);
(Continued)

(58) Field of Classification Search
CPC ......... H01L 21/76801; H01L 21/76829; H01L 21/76822; H01L 24/80; H01L 23/535; H01L 24/08
See application file for complete search history.

(56) References Cited

U.S. PATENT DOCUMENTS

| 2003/0201465 A1 | 10/2003 | Ryuzaki et al. |
| 2013/0207271 A1 | 8/2013 | Hagimoto et al. |

(Continued)

FOREIGN PATENT DOCUMENTS

CN 102364673 A * 2/2012

OTHER PUBLICATIONS

Final Office Action from U.S. Appl. No. 16/586,279 dated Aug. 18, 2021, 13 pgs.
(Continued)

*Primary Examiner* — Selim U Ahmed
*Assistant Examiner* — Evan G Clinton
(74) *Attorney, Agent, or Firm* — Essential Patents Group, LLP

(57) ABSTRACT

An integrated circuit interconnect structure includes a first interconnect in a first metallization level and a first dielectric adjacent to at least a portion of the first interconnect, where the first dielectric having a first carbon content. The integrated circuit interconnect structure further includes a second interconnect in a second metallization level above the first metallization level. The second interconnect includes a lowermost surface in contact with at least a portion of an uppermost surface of the first interconnect. A second dielectric having a second carbon content is adjacent to at least a portion of the second interconnect and the first dielectric. The first carbon concentration increases with distance away from the lowermost surface of the second interconnect and the second carbon concentration increases with distance away from the uppermost surface of the first interconnect.

18 Claims, 12 Drawing Sheets

(51) Int. Cl.
  *H01L 23/535* (2006.01)
  *H01L 23/00* (2006.01)
  *H04B 1/40* (2015.01)
(52) U.S. Cl.
  CPC .. *H01L 21/76829* (2013.01); *H01L 21/76832* (2013.01); *H01L 23/528* (2013.01); *H01L 23/535* (2013.01); *H01L 24/08* (2013.01); *H01L 24/80* (2013.01); *H04B 1/40* (2013.01); *H01L 2224/08146* (2013.01); *H01L 2224/80895* (2013.01)

(56) References Cited

U.S. PATENT DOCUMENTS

| | | | | |
|---|---|---|---|---|
| 2015/0108644 A1* | 4/2015 | Kuang | ................... | H01L 25/50 257/777 |
| 2015/0357296 A1* | 12/2015 | Liu | ........................ | H01L 24/03 438/612 |
| 2018/0240797 A1 | 8/2018 | Yokoyama et al. | | |
| 2018/0269161 A1 | 9/2018 | Wu et al. | | |
| 2019/0109042 A1* | 4/2019 | Katkar | .............. | H01L 21/76831 |
| 2019/0333871 A1 | 10/2019 | Chen et al. | | |
| 2020/0350322 A1* | 11/2020 | Liu | ..................... | H01L 21/2007 |
| 2020/0411473 A1 | 12/2020 | Chen et al. | | |

OTHER PUBLICATIONS

Non-Final Office Action from U.S. Appl. No. 16/586,279 dated Mar. 4, 2021, 13 pgs.
Non-Final Office Action from U.S. Appl. No. 16/586,279 dated Nov. 12, 2021, 14 pgs.
Notice of Allowance from U.S. Appl. No. 16/586,279 dated Apr. 11, 2022, 8 pgs.
Restriction Requirement from U.S. Appl. No. 16/586,279 dated Oct. 1, 2020, 6 pgs.

* cited by examiner

INTERCONNECT STRUCTURES AND METHODS OF FABRICATION

CLAIM OF PRIORITY

This application is a continuation of, and claims the benefit of priority to, U.S. patent application Ser. No. 16/586,279, filed on Sep. 27, 2019 and titled "INTERCONNECT STRUCTURES AND METHODS OF FABRICATION," which is incorporated by reference in entirety.

BACKGROUND

Process of hybrid bonding between two substrates requires uppermost surfaces of various integrated circuit elements on the two substrates to be substantially co-planar. Co-planarity of surfaces of the various integrated circuit elements is desirable to prevent defects and facilitate alignment between structures. Achieving co-planarity between exposed surfaces of uppermost layers is challenging when the substrates include conductive as well as insulating materials that have been planarized by chemical mechanical polish processes. Thus, implementing materials adjacent to conductive materials that have a wide variety of properties such as, for example, high selectivity to polish and ease of patterning is highly desirable. It is with respect to these and other considerations that various implementations and material structures are discussed. Such improvements may become critical with increased need for fabrication of stacked high-density high-performance transistors.

DESCRIPTION OF THE EMBODIMENTS

Figure 1A:
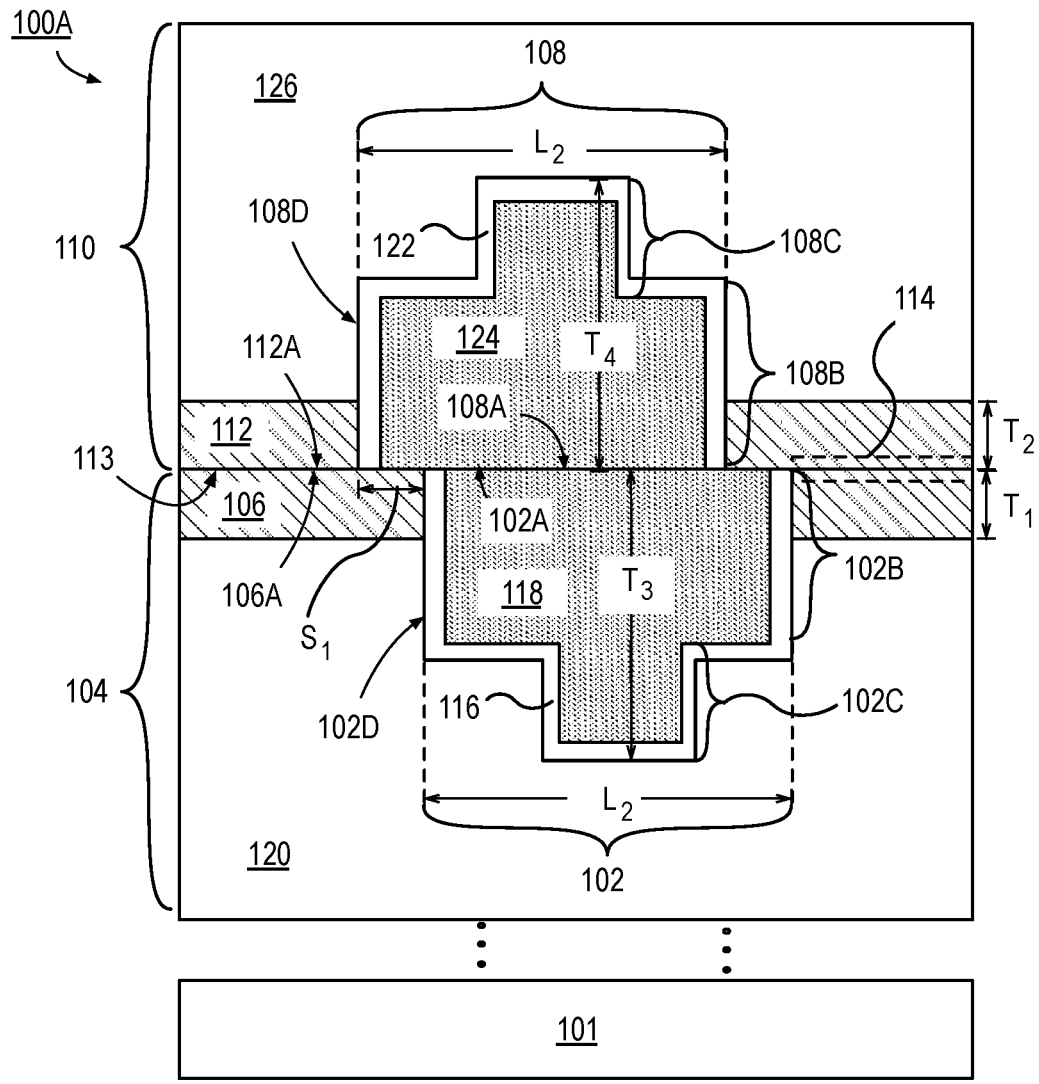
FIG. 1A illustrates a cross-sectional view of an integrated circuit interconnect structure, in accordance with an embodiment of the present disclosure.

An integrated circuit interconnect structure and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

The integrated circuit interconnect structure is an intervening substrate used to bridge a first substrate to a second substrate. The first substrate may be, for instance, an integrated circuit die including one or more transistors. The second substrate may be, for instance, a memory module, a computer motherboard, or another integrated circuit die including one or more transistors. Generally, the purpose of an integrated circuit interconnect structure is to spread a connection to a wider pitch or to reroute a connection to a different connection. For example, an integrated circuit interconnect structure may couple an integrated circuit die to one or more transistors that can subsequently be coupled to the second substrate. In some embodiments, the first and second substrates are mechanically bonded to opposing sides of the integrated circuit interconnect structure. In other embodiments, the first and second substrates are mechanically bonded to a same side of the integrated circuit interconnect structure. While methods utilized to mechanically bond two substrates have been developed, challenges arise in the planarity and preparation of uppermost bonding surfaces before the mechanical bonding process. In particular, while forming substrates with desired integrated circuit element structures, top surfaces of the substrates are not necessarily planar. When two substrates are mechanically bonded together, it is highly desirable for the two bonding surfaces to be free of defects and substantially planar to avoid formation of voids after the bonding process.

Traditionally utilized dielectric materials with low dielectric constants suffer from dishing, gouging and surface irregularities during the process utilized to form metallization interconnects. Dishing in the dielectric materials can also lead to dishing in the interconnect lines themselves. When two substrates with significant dishing and surface irregularities are bonded, voids may be formed. In some cases, the voids are present between interconnect lines themselves leading to open circuits or increased electrical resistance between partially connected interconnects from two different substrates during operation.

However, this situation may be mitigated by replacing a conventional dielectric with a dielectric having a carbon or carbon and nitrogen in the composition of the dielectric as an upper most layer of a material layer stack. A dielectric having carbon or carbon and nitrogen facilitates the polish process because even a relatively thin layer (for example between 5 nm-20 nm) can act an etch stop. As integrated circuit structures are scaled, having a thin material that can act as an etch stop is particularly desirable to minimize aspect ratio during the fabrication process. A robust polish etch stop can also prevent dishing of the interconnect material and mitigate open circuit or increased electrical resistance.

A dielectric including carbon or carbon and nitrogen also has an additional advantage in that it acts as a diffusion blocker against electro-migration of certain metals (for example copper). When two substrates are mechanically bonded together, the interconnect structure in one substrate may not always align perfectly with an interconnect structure in a second substrate. In such cases, portions of the interconnect structures may be in contact with portions of the dielectric including carbon or carbon and nitrogen. The dielectric including carbon or carbon and nitrogen can then block diffusion of interconnect materials from diffusing into undesirable regions of the substrate and causing electrical problems.

While dielectric including carbon or carbon and nitrogen may be useful to block diffusion, enabling bonding between two different substrates where the bonding interfaces include carbon containing materials can be challenging. However, a chemical treatment can be performed of an uppermost surface of the dielectric that includes carbon or carbon and nitrogen. to reduce the carbon content. The treatment can reduce carbon content in the vicinity of uppermost surfaces of bonding substrates yielding suitable surfaces for bonding, and provide additional advantages such as preventing copper diffusion, for example, once the wafers are bonded.

In accordance with an embodiment of the present disclosure an integrated circuit interconnect structure includes a first interconnect in a first metallization level and a first dielectric adjacent to at least a portion of the first interconnect, where the first dielectric has a first carbon content. The integrated circuit interconnect structure further includes a second interconnect in a second metallization level above the first metallization level. The second interconnect includes a lowermost surface in contact with at least a portion of an uppermost surface of the first interconnect. A second dielectric is adjacent to at least a portion of the second interconnect and directly adjacent to the second dielectric, where the second dielectric has a second carbon content. The first carbon concentration increases with distance away from the lowermost surface of the second interconnect and the second carbon concentration increases with distance away from the uppermost surface of the first interconnect.

FIG. 1A illustrates an isometric view of an integrated circuit interconnect structure 100A above a substrate 101, in accordance with an embodiment of the present disclosure. In an exemplary embodiment, the integrated circuit interconnect structure 100A includes a first interconnect 102 in a first metallization level 104 and a first dielectric 106 adjacent to at least a portion of the interconnect 102, where the dielectric 106 has a first carbon content. The integrated circuit interconnect structure 100A further includes a second interconnect 108 in a second metallization level 110 above the first metallization level 104. The interconnect 108 includes a lowermost surface 108A in contact with at least a portion of an uppermost surface of the interconnect 102A. A dielectric 112 is adjacent to at least a portion of the interconnect 108 and directly adjacent to the dielectric 106, where the dielectric 112 has a second carbon content.

The dielectric 106 has an uppermost surface 106A that is substantially coplanar with uppermost interconnect surface 102A. The dielectric 112 has a lowermost surface 112A that is substantially coplanar with the lowermost interconnect surface 108A. Dielectric surfaces 102A and 112A are in contact with each other, as shown. In exemplary embodiments, interface 113 between the dielectric 106 and dielectric 112 is substantially free of voids.

It is to be appreciated that the dielectric 106 and 112 each include materials that are capable of providing a diffusion barrier. The dielectric 106 and 112 may also include materials with a dielectric constant between 4 and 9. In an embodiment, the dielectric 106 includes silicon, carbon and least one or more of oxygen and nitrogen and the dielectric 112 includes silicon, carbon and least one or more of oxygen and nitrogen. In other embodiments, the dielectric 106 includes silicon, carbon, oxygen and nitrogen and the dielectric 112 includes silicon, carbon, oxygen and nitrogen. In an embodiment, dielectric 106 and dielectric 112 includes a same material including a substantially same carbon content. In other embodiments, dielectric 106 and dielectric 112 include different carbon contents. In some embodiments, the first carbon content is between 2% and 30% of the dielectric 106 and the second carbon content is between 2% and 30% of the dielectric 112. It is to be appreciated that the first carbon content and the second carbon content may vary proximate to the interface 113. For example, the carbon content in dielectric 106 may increase with distance away from the dielectric surface 106A and the carbon content in dielectric 112 may increase with distance away from the dielectric surface 112A.

Figure 1B:
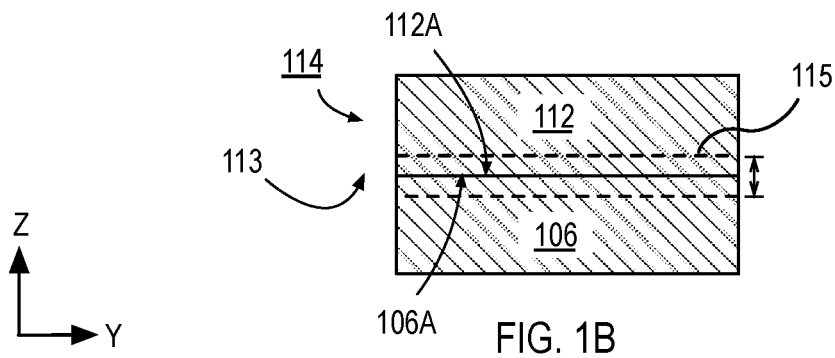
FIG. 1B illustrates an enhanced cross-sectional view of a section of the integrated circuit interconnect structure in FIG. 1A.

FIG. 1B is an enhanced cross-sectional illustration of a portion 114 of the dielectric 106 and 112 at the interface 113. A region 115 (in dashed lines) within the dielectric 106 and dielectric 112 at the interface 113 is shown to illustrate a vertical extent (in the Z-direction) over which the carbon content may vary in the dielectric 106 and dielectric 112. In an embodiment, the region including the interface between the dielectric 106 and the dielectric 112 has a vertical thickness of at most 1 nm.

Referring once again to FIG. 1A, in an embodiment, the dielectric 106 has a vertical thickness, $T_1$, (in the Z-direction) and the dielectric 112 has a vertical thickness, $T_2$ (in the Z-direction) as shown. $T_1$ and $T_2$ may be substantially the same or different. In an embodiment, $T_1$ is between 2 nm and 20 nm and $T_2$ is between 2 nm and 20 nm. The combined thicknesses, $T_1$ and $T_2$ of the dielectric 106 and dielectric 112, respectively, may vary laterally along the Y-direction. In some examples, the combined thickness of $T_1$ and $T_2$ varies by at least 5% away from the interconnect 102 or 108.

Shapes of the interconnects 102 and 108 may vary depending on application. As shown, the interconnect 102 has a wide upper portion 102B and a narrow lower portion 102C and interconnect 108 has a wide lower portion 108C and a narrow upper portion 108B. As shown the wide upper portion 102B of the interconnect 102 is in contact with the wider lower portion 108B of the interconnect 108. The interconnects 102 and 108 may have a substantially same lateral dimension (along the Y-direction) or be substantially different. As shown, interconnect 102 has a lateral dimension $L_1$ and the interconnect 108 has a lateral dimension $L_2$. Depending on embodiments, $L_1$ and $L_2$ may range from 50 nm to over 1 micron.

In examples where $L_1$ and $L_2$ are substantially equal, the interconnect 102 and interconnect 108 may be substantially aligned along the Y-direction. In other examples, such as is illustrated, the interconnect 102 and interconnect 108 may be misaligned along the Y direction. A misalignment between respective sidewall 102D of the interconnect 102 and sidewall 108D of the interconnect 108 is indicated by a spacing $S_1$. In an embodiment, $S_1$ may be 50 nm or more. In some such embodiments, the dielectric 112 is on a portion of the uppermost interconnect surface 102A and a lowermost interconnect surface 108A is on a portion of the dielectric 106. When portions of the dielectric surface 106A and dielectric surface 112A are in contact with the interconnect 102 and interconnect 108, respectively, the material of the dielectric 106 and dielectric 112 act as diffusion barriers against the material of the interconnect 102 and interconnect 108.

In some embodiments, where interconnect 102 and interconnect 108 are laterally misaligned as is shown in FIG. 1A, the carbon content in dielectric 106 increase with distance away from the lowermost interconnect surface 108A and the carbon content in dielectric 112 increases with distance away from the uppermost interconnect surface 102A.

In an embodiment, the interconnect 102 further includes an adhesion layer 116 and a fill metal 118 adjacent to the adhesion layer 116. The adhesion layer 116 may include ruthenium or tantalum and the fill metal 118 may include tungsten, cobalt, nickel or copper. The fill metal 118 is insulated from the dielectric 106 by the adhesion layer 116. The adhesion layer 116 provides robust adhesion for the fill material 118 and also prevents fill metal 118 material from migrating away to other regions (such as neighboring interconnect structures). Such an adhesion layer is particularly useful when a vertical thickness, $T_3$, of the interconnect 102 is greater than $T_1$. In general, $T_3$ may be the same or different from $T_4$. When $T_1$ is less than $T_3$, there may be other materials adjacent to the interconnect 102.

In the illustrative embodiment, a third dielectric 120 is directly adjacent to the interconnect 102 and directly below the dielectric 106. In some such embodiment, the dielectric 120 includes a material with less carbon content than the dielectric 106. In some embodiments, the carbon content of the dielectric 120 is zero. The dielectric 120 may include silicon, and at least one of oxygen or nitrogen.

In the metallization level 110, the interconnect 108 may also have a structure that is substantially the same as the interconnect 102. For example, as illustrated in FIG. 1A, interconnect 108 further includes an adhesion layer 122 and a fill metal 124 adjacent to the adhesion layer 122. The fill metal 124 is insulated from the dielectric 112 by the adhesion layer 122. The adhesion layer 122 provides robust adhesion for the fill metal 124 and also prevents the fill metal 124 material from migrating away to other regions. Such an adhesion layer is also useful when a vertical thickness, $T_4$, of the interconnect 108 is greater than $T_2$. When $T_2$ is less than $T_4$, there may be other materials adjacent to the interconnect 108.

In the illustrative embodiment, a fourth dielectric 126 is directly adjacent to the interconnect 108 and directly above the dielectric 112. In some such embodiment, the dielectric 126 includes a material with less carbon content than the dielectric 112. In some embodiments, the carbon content of the dielectric 126 is zero. The dielectric 126 may include silicon, and at least one of oxygen or nitrogen.

Figure 1C:
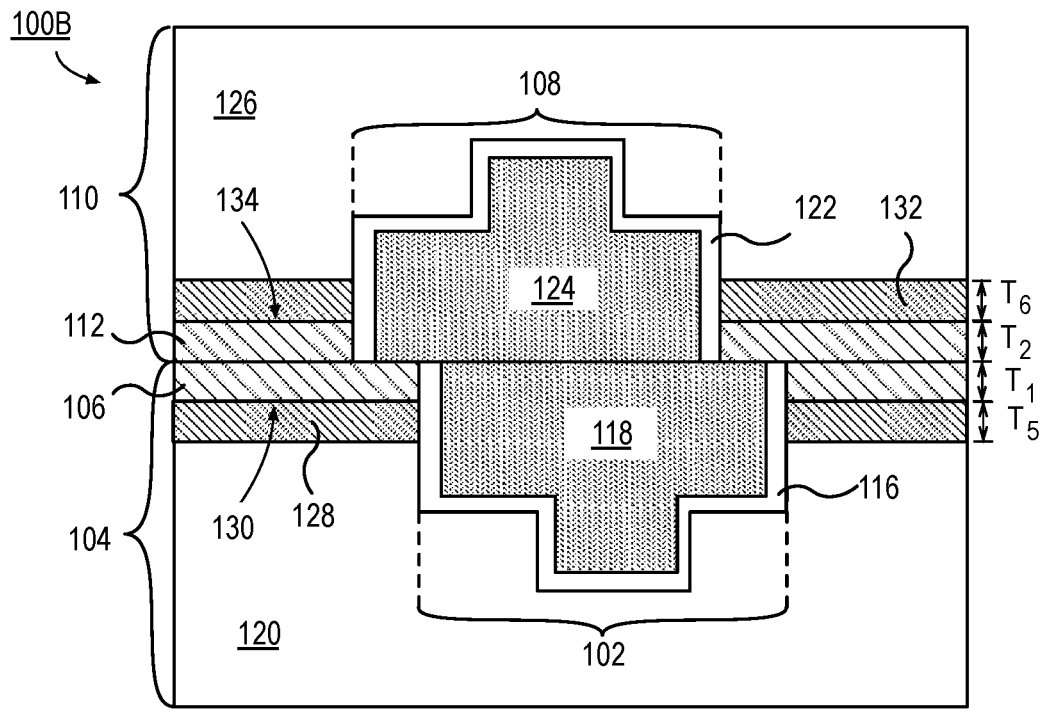
FIG. 1C illustrates a cross-sectional view of an integrated circuit interconnect structure, in accordance with an embodiment of the present disclosure.

In other examples, the integrated circuit interconnect structure 100A may include further levels of dielectric adjacent to the interconnect 102 or interconnect 108. FIG. 1C is a cross-sectional illustration of an integrated circuit interconnect structure 100B where the metallization level 104 includes a fifth dielectric 128 adjacent to the interconnect 102 and between the dielectric 106 and the dielectric 120. In an embodiment, the dielectric 128 includes a material that is similar to the dielectric 120. In an embodiment, the dielectric 128 includes less carbon than the carbon content of dielectric 106. In some embodiments, dielectric 128 includes silicon and oxygen. In other embodiments, dielectric 128 includes silicon, oxygen and nitrogen, where the nitrogen content is less than a nitrogen content in dielectric 106. In exemplary embodiments, dielectric 128 contains trace amounts of carbon at an immediate vicinity of interface 130 between dielectric 106 and dielectric 128, but no carbon across the vertical extent (along Z-direction) of the dielectric 128. The dielectric 128 has a thickness, $T_5$, as shown. Depending on applications and shape and size of the interconnect 102, $T_5$ may be greater than or less than $T_1$. In exemplary embodiments, $T_5$ is between 2 nm and 10 nm. It is to be appreciated that in some embodiments, the sum of $T_1$ and $T_5$ may vary by at least 5% in the Y-direction. Such variations may be a result of the fabrication method utilized to form interconnect 102.

In the illustrative embodiment, integrated circuit interconnect structure 100B further includes a sixth dielectric 132 adjacent to the interconnect 108 and between the dielectric 112 and the dielectric 126. In an embodiment, the dielectric 132 includes a material that is similar to the dielectric 126.

In an embodiment, the dielectric 132 includes less carbon than the carbon content of dielectric 112. In some embodiments, dielectric 132 includes silicon and oxygen. In other embodiments, dielectric 132 includes silicon, oxygen and nitrogen, where the nitrogen content is less than a nitrogen content in dielectric 112. In exemplary embodiments, dielectric 132 contains trace amounts of carbon at an immediate vicinity of interface 134 between dielectric 112 and dielectric 132, but no carbon across the vertical extent (along Z-direction) of the dielectric 132. The dielectric 132 has a thickness, $T_6$, as shown. Depending on application, shape and size of the interconnect 102, $T_6$ may be greater than or less than $T_2$. In exemplary embodiments, $T_6$ is between 2 nm and 10 nm. It is to be appreciated that in some embodiments, the sum of $T_2$ and $T_6$ may vary by at least 5% in the Y-direction. Such variations may be a result of the fabrication method utilized to form interconnect 108.

Figure 1D:
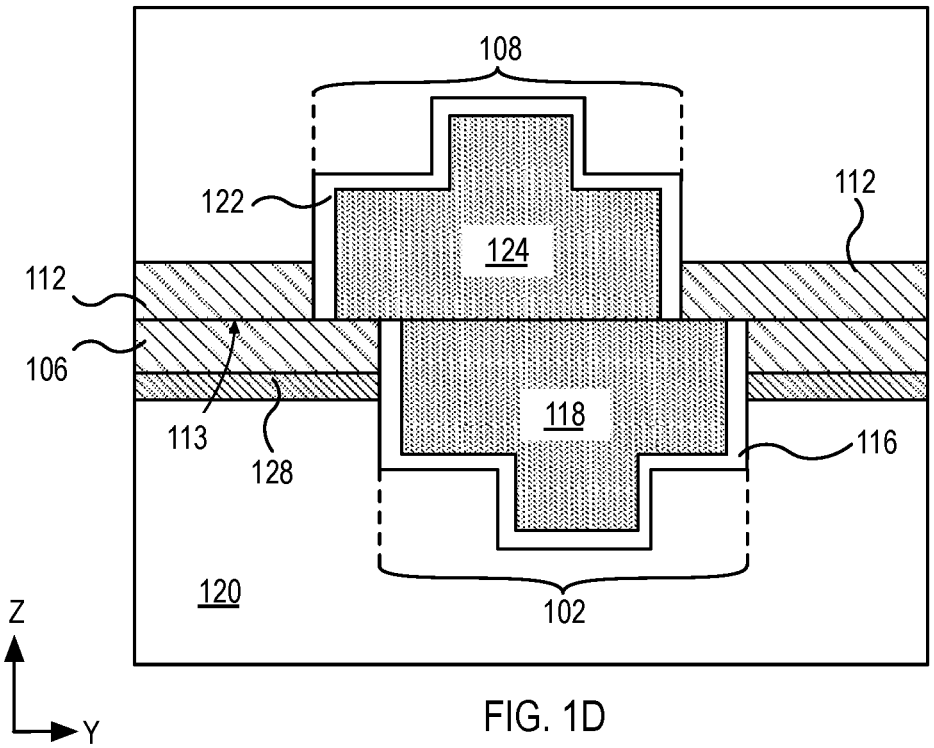
FIG. 1D illustrates a cross-sectional view of an integrated circuit interconnect structure, in accordance with an embodiment of the present disclosure.

In other embodiments, one of the metallization levels 104 or 110 may have more levels of dielectric adjacent to a respective interconnect as illustrated in FIG. 1D. In the illustrative embodiment, dielectric 128 is present in the metallization level 110 between the dielectric 106 and dielectric 120 and adjacent to the interconnect 102. In some such embodiment, the properties of the dielectric 106 and dielectric 112 adjacent to interface 113 may be substantially similar to properties of the dielectric 106 and dielectric 112 described above in association with integrated circuit interconnect structure 100A.

Figure 1E:
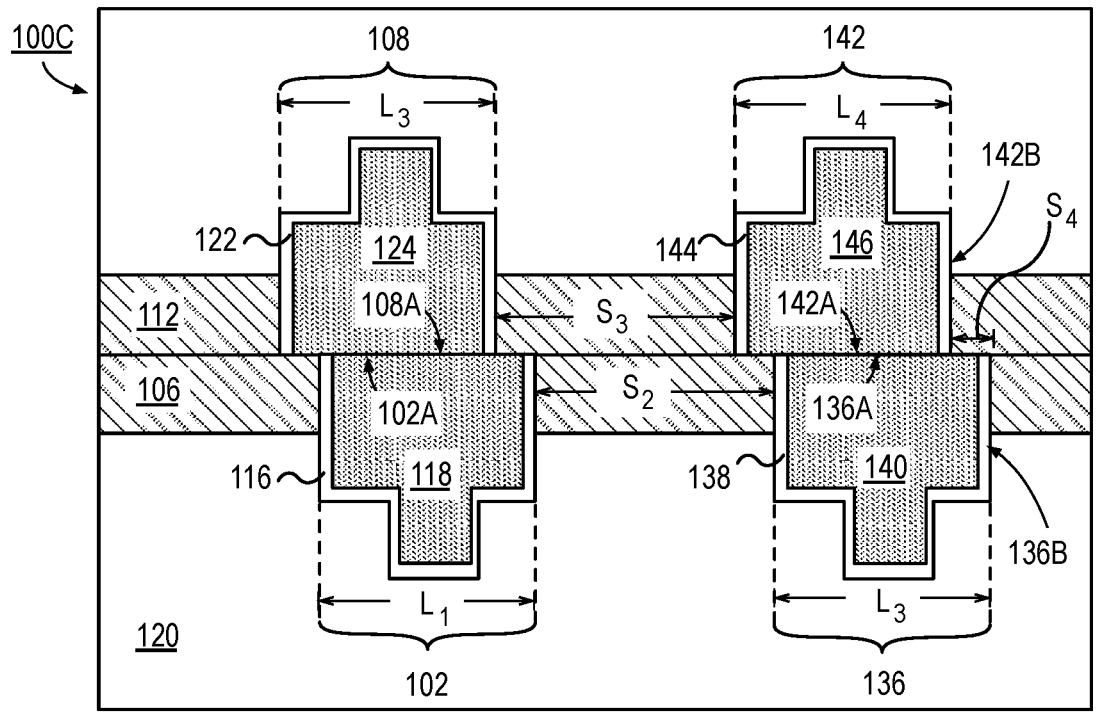
FIG. 1E illustrates a cross-sectional view of an integrated circuit interconnect structure depicting two pairs of conductive interconnects.

In some embodiments, the metallization levels 104 and 110 include more than a single interconnect where the shapes and sizes of the interconnects may be different from each other. FIG. 1E is a cross sectional illustration of an integrated circuit interconnect structure 100C where the metallization level 104 further includes a third interconnect 136 adjacent to the dielectric 106 and spatially distant from the interconnect 102. In the illustrative embodiment, the interconnect 136 has an uppermost surface 136A that is substantially coplanar with the uppermost interconnect surface 102A. As shown, interconnect 136 is spatially distant from the interconnect 102 by an amount $S_2$. In an embodiment, $S_2$ ranges between 100 nm and 1 micron.

In an embodiment, interconnect 136 has one or more properties of the interconnect 102, such as lateral and vertical thicknesses, and material composition. For example, as shown, the interconnect 136 includes an adhesion layer 138 adjacent to the dielectric 106 and dielectric 120 and a fill metal 140 adjacent to the adhesion layer 138. The adhesion layer 138 and the fill metal 140 may include a material that is the same or substantially the same as the material of the adhesion layer 116 and the fill metal 118.

The integrated circuit interconnect structure 100C further includes a fourth interconnect 142 adjacent to the dielectric 112 and spatially distant from the interconnect 108. In the illustrative embodiment, the interconnect 142 has a lowermost surface 142A that is substantially coplanar with the lowermost interconnect surface 108A. As shown, interconnect 142 is spatially distant from the interconnect 108 by an amount $S_3$. In an embodiment, $S_3$ ranges between 100 nm and 1 micron.

In an embodiment, interconnect 142 has one or more properties of the interconnect 108, such as lateral and vertical thicknesses and material composition. For example, as shown, the interconnect 142 includes an adhesion layer 144 adjacent to the dielectric 112 and dielectric 120 and a fill metal 146 adjacent to the adhesion layer 144. The adhesion layer 144 and the fill metal 146 may include a material that is the same or substantially the same as the material of the adhesion layer 122 and the fill metal 124.

In some embodiments, $S_2$ is substantially equal to $S_3$. In other embodiments, $S_2$ is different from $S_3$. A lateral dimension, $L_3$, of the interconnect 136 may be substantially equal or different from a lateral dimension, $L_4$, of the interconnect 142. In examples where $L_1$ and $L_2$ are substantially equal, the interconnect 136 and interconnect 142 may be substantially aligned along the Y-direction. In other examples, such as is illustrated, the interconnect 136 and interconnect 142 may misaligned along the Y direction. The degree of misalignment between respective sidewalls of the interconnect 136 and interconnect 142 is indicated by a spacing $S_1$. In an embodiment, $S_1$ may be 50 nm or more. In some such embodiments, the dielectric 112 is on a portion of the uppermost interconnect surface 136A and a lowermost interconnect surface 142A is on a portion of the dielectric 106. When portions of the dielectric surface 106A and dielectric surface 112A are in contact with the interconnects 142 and 136, respectively, the material of the dielectric 106 and dielectric 112 act as diffusion barriers against the material of the interconnect 136 and interconnect 142.

In examples where $L_1$ and $L_2$ are substantially equal, the interconnect 136 and interconnect 142 may be substantially aligned along the Y-direction. In other examples, such as is illustrated, the interconnect 136 and interconnect 142 may be misaligned along the Y direction. A degree of misalignment between respective sidewall 136B of the interconnect 136 and sidewall 142B of interconnect 142 is indicated by a spacing $S_4$. In an embodiment, $S_4$ may be between 0 nm and 500 nm. In some such embodiments, $S_4$ depends on the lateral dimensions, $L_3$ and $L_4$. It is to be appreciated that when $L_4$ is comparable to $S_3$, $L_4$ may not be substantially equal to $S_4$ to prevent overlap between interconnect 142 and 102 or contact between interconnect 108 and interconnect 142.

In embodiments where $S_4$ is non-zero, the dielectric 112 is on a portion of the uppermost interconnect surface 136A and a lowermost interconnect surface 142A is on a portion of the dielectric 106. When portions of the dielectric surface 106A and dielectric surface 112A are in contact with the interconnects 142 and 136, respectively, the material of the dielectric 106 and dielectric 112 act as diffusion barriers against the material of the interconnect 136 and interconnect 142.

Figure 1F:
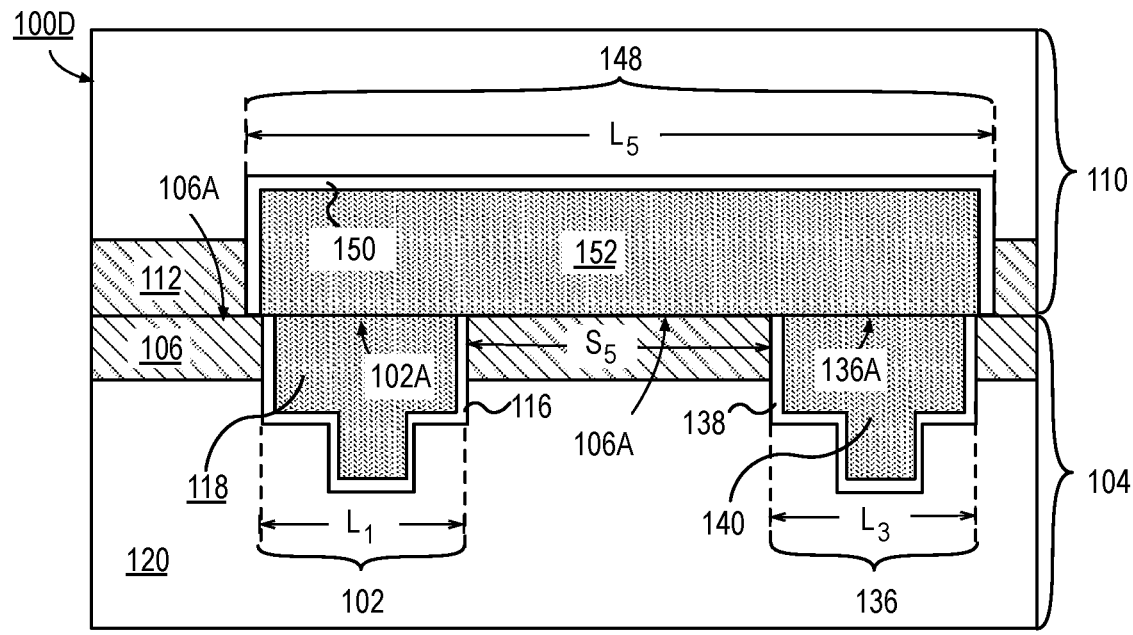
FIG. 1F illustrates a cross-sectional view of an integrated circuit interconnect structure depicting a pair of conductive interconnects in contact with an interconnect line segment.

In some applications, the metallization level 104 includes an interconnect or an interconnect line segment and the metallization level 110 includes an interconnect or an interconnect line segment. FIG. 1F is a cross-sectional illustration of an integrated circuit interconnect structure 100D where the metallization level 104 includes interconnect 102 and interconnect 136 separated by dielectric 106 and dielectric 120. The interconnect 102 and interconnect 136 are laterally separated from each other by a distance $S_5$. The integrated circuit interconnect structure 100D further includes an interconnect line segment 148 in the metallization level 110. In the illustrative embodiment, the interconnect line segment 148 is in contact with uppermost interconnect surface 102A, uppermost interconnect surface 136A and uppermost dielectric surface 106A.

In an embodiment, the interconnect line segment 148 has a lateral dimension $L_5$ (along the Y direction). As shown, $L_5$ is substantially equal to a combined sum of the lateral dimensions $L_1$ and $L_2$ of the interconnect 102 and interconnect 136, respectively, and the lateral separation distance $S_5$. In other embodiments, $L_5$ is substantially greater than a combined sum of the lateral dimensions $L_1$ and $L_2$ of the interconnect 102 and interconnect 136, respectively, and the lateral separation distance $S_5$. In some such embodiments, interconnect line segment 148 may be in contact with more than 2 interconnects such as interconnect 102 or interconnect 136. In other embodiments, $L_5$ is less than a combined sum of the lateral dimensions $L_1$ and $L_2$ of the interconnect 102 and interconnect 136, respectively, and the lateral separation distance $S_5$. In some such embodiments, the interconnect line segment 148 is in contact with portions of uppermost interconnect surface 102A and in contact with portions of uppermost interconnect surface 136A. Furthermore, in some such embodiments, portions of uppermost interconnect surface 102A and portions of uppermost interconnect surface 136A are in contact with the lowermost dielectric surface 112A.

In an embodiment, the interconnect line segment 148 includes one or more features of the interconnect 102 or interconnect 136. In an exemplary embodiment, interconnect line segment 148 includes an adhesion layer 150 adjacent to the dielectric 106 and dielectric 120 and a fill metal 152 adjacent to the adhesion layer 150. As illustrated, adhesion layer 150 and fill metal 152 are in contact with uppermost dielectric surface 106A.

In other embodiments, the interconnect line segment 148 is in contact with between 3 and 20 interconnects, such as interconnect 102 or interconnect 136, in the metallization level 104.

Referring again to FIG. 1A, in an embodiment, the substrate 101 includes a suitable semiconductor material such as but not limited to, single crystal silicon, polycrystalline silicon and silicon on insulator (SOI). In another embodiment, substrate 108 includes other semiconductor materials such as germanium, silicon germanium or a suitable group III-N or a group III-V compound. In other embodiments, substrate 101 includes silicon and at least one or more of oxygen, carbon or nitrogen, for example, SiO2, SiOC, SiOCN, SiN or SiC. In some examples, the substrate 101 includes a material that is substantially similar to a material of the dielectric 120. Logic devices such as MOSFET transistors and access transistors and may be formed on the substrate 101. Logic devices such as access transistors may be integrated with one or more integrated circuit interconnect structures 100A-D and memory devices such as SOT memory devices to form embedded memory. Embedded memory including SOT memory devices and logic MOSFET transistors may be combined to form functional integrated circuit such as a system on chip.

Figure 2:
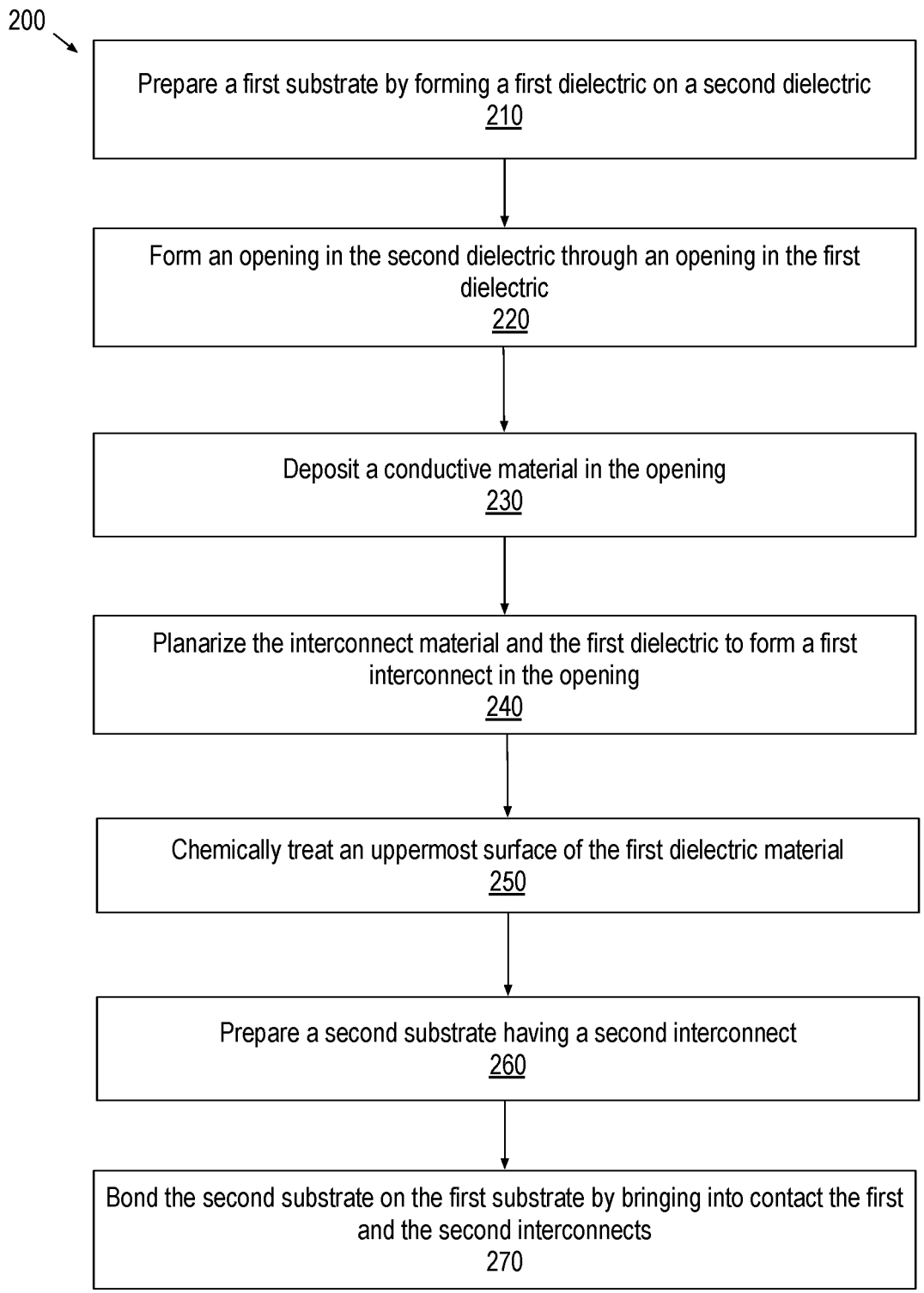
FIG. 2 illustrates a flow diagram for a method to fabricate an integrated circuit interconnect structure, in accordance with an embodiment of the present disclosure.

FIG. 2 illustrates a flow diagram for a method to fabricate an integrated circuit interconnect structure, in accordance with an embodiment of the present disclosure. The method 200 begins at operation 210 by preparing a first substrate by forming a second dielectric on a first dielectric. The method 200 continues at operation 220 with the formation an opening in the second dielectric through an opening in the first dielectric. The method 200 continues at operation 230 with the deposition of a conductive material in the opening. The method 200 continues at operation 240 with planarization of the conductive material and an upper portion of the second dielectric to form a first interconnect. The method 200 continues at operation 250 with a process to chemically treat the second dielectric. The method 200 continues at operation 260 with a preparation of a second substrate and the formation of at least a second interconnect in the second substrate in a manner substantially similar to the formation of the first interconnect. After chemically treating the second substrate the method concludes at operation 270 with a process to bond the second substrate on the first substrate by bringing into contact the first interconnect and second interconnect.

Figure 3A:
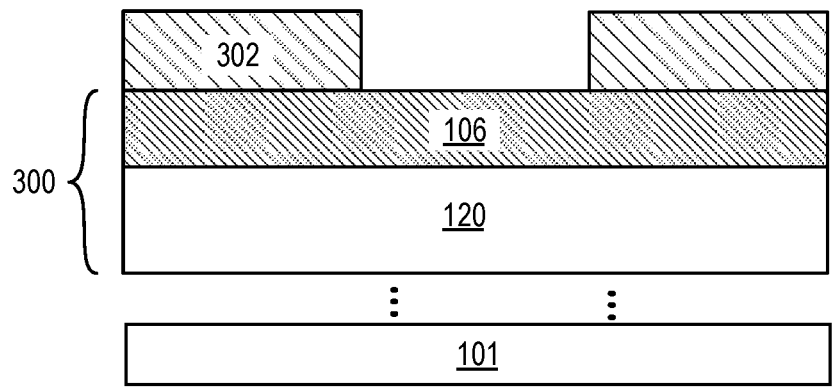
FIG. 3A illustrates a cross-sectional view of a material layer stack of a first wafer.

FIG. 3A illustrates a cross-sectional view of a material layer stack 300 including a first dielectric 120 above a substrate, a second dielectric 106 on the first dielectric 120 and a mask 302 on the second dielectric 106. In an embodiment, the first dielectric 120 includes silicon and at least one or more of oxygen or nitrogen. The dielectric 106 may be blanket deposited above the substrate by a plasma enhanced chemical vapor deposition (PECVD) or a chemical vapor deposition (CVD) process. In an embodiment, the dielectric 106 is blanket deposited on the dielectric 120 by a (PECVD) or a chemical vapor deposition (CVD) process. In an embodiment, the deposition process involves doping the dielectric with carbon. The percent of carbon in the dielectric 106 can be controlled during the deposition process and ranges between 2 and 30 atomic percent of the dielectric 106. In exemplary embodiments, the carbon is uniformly doped in the dielectric 106 during the deposition process. The mask 302 may be formed on the material layer stack 300 by a lithographic process. The mask 302 defines a location where a trench will be formed. In some embodiments, there are other integrated circuit components (for example one or more transistors) below the dielectric 120 in one or more intervening layers between the dielectric 120 and the substrate 101, as will be discussed further below.

Figure 3B:
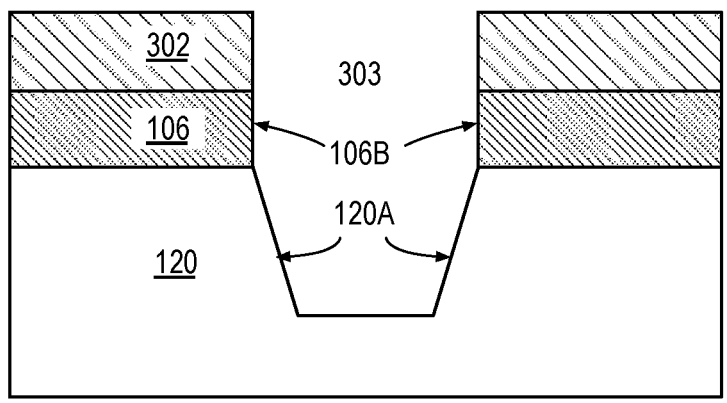
FIG. 3B illustrates the structure of FIG. 3A following the process to form an opening in the second dielectric and partially in the first dielectric.

FIG. 3B illustrates the structure of FIG. 3A following the process to form an opening 303 in the dielectric 106 and partially in the dielectric 120. In an embodiment, a plasma etch process is utilized to etch the dielectric 106 and the dielectric 120. In an embodiment, the plasma etch process is sufficiently anisotropic and forms sidewalls 106B that are substantially vertical in the dielectric 106. In an embodiment, the plasma etch process may form tapered sidewalls 120A in the dielectric 120, as illustrated. In other embodiments, the sidewalls may be tapered. In another embodiment, the process to form the trench involves forming a first trench having a first width and then followed by formation of a second trench having a second width where the second width is larger than the first width. A larger second width may be formed to enable subsequent filling of the first and second trenches in a downstream operation.

In another embodiment, the opening 303 may be substantially wide to form an interconnect line segment described in association with FIG. 1F.

Figure 3C:
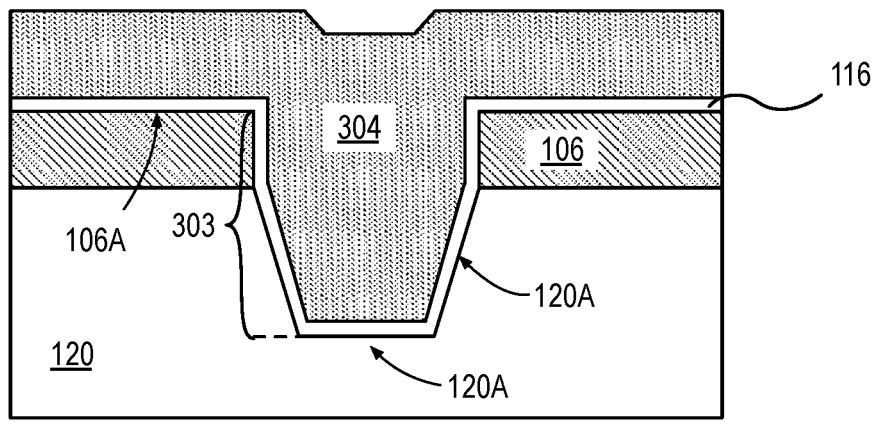
FIG. 3C illustrates cross-sectional view of the structure in FIG. 3B following a process to deposit a conductive material in the opening.

FIG. 3C illustrates cross-sectional view of the structure in FIG. 3B following a process to deposit a conductive material in the opening 303. In an embodiment, the deposition process includes blanket depositing an adhesion layer 116 in the opening 303 on the sidewalls 120A, on the surface 120B of the dielectric 120, on the sidewalls 106B of the dielectric 106 and on the dielectric surface 106A. The adhesion layer 116 may be deposited to a thickness between 1 nm and 3 nm. In an embodiment, the adhesion layer 116 includes ruthenium or tantalum and adheres to the dielectric 120 and the dielectric 106. The deposition process is continued with the blanket deposition of a fill metal layer 304 on the adhesion layer 116. In an embodiment, the deposition process may include a physical vapor deposition (PVD), CVD or atomic layer deposition (ALD) process. In an embodiment, the fill metal layer includes tungsten, cobalt, nickel, or copper. The deposition process may include a physical vapor deposition (PVD), CVD, atomic layer deposition (ALD) or an electrochemical deposition process.

Figure 3D:
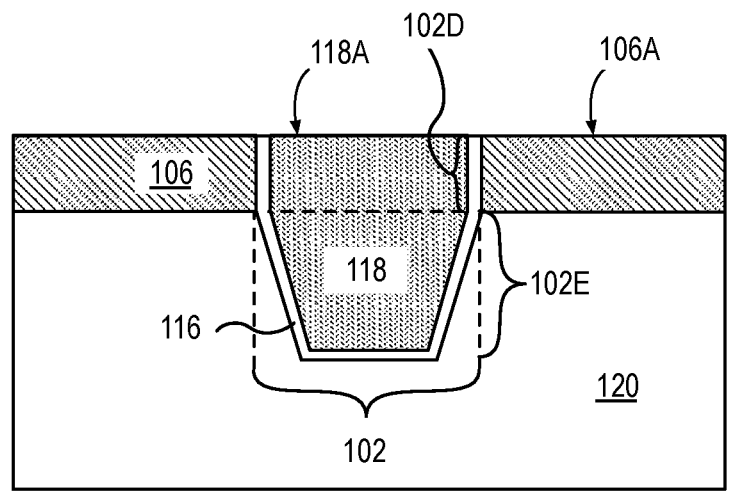
FIG. 3D illustrates a cross-sectional view of the structure of FIG. 3C following the process of forming an interconnect in the opening adjacent to the first and the second dielectrics.

FIG. 3D illustrates a cross-sectional view of the structure of FIG. 3C following the process of forming an interconnect 102. In an embodiment, a planarization process such as a chemical mechanical polish (CMP) process is carried out to form the interconnect 102. In an embodiment, the CMP process removes the excess fill metal layer 304 above the dielectric surface 106A. The CMP process may be continued until the adhesion layer 116 is removed from above the dielectric surface 106A. In an embodiment, an upper portion of the dielectric 106 is also removed by the CMP process.

The CMP process leaves an uppermost dielectric surface 106A that is co-planar or substantially co-planar with an uppermost surface 118A of the fill metal 118 and an uppermost portion of the adhesion layer 116 as shown. The presence of carbon in the dielectric enables the CMP process to form substantially coplanar surfaces 118A and 106A with substantially no dishing. A substantially co-planar surface enables a second wafer with an interconnect to bond to the interconnect 102 in a downstream operation. The dielectric 106 may have a thickness ranging between 2 nm and 20 nm after the CMP process. In an embodiment, the interconnect 102 formed has a first portion 102D adjacent to the dielectric 106 and a second portion 102E formed adjacent to the dielectric 120.

Figure 3E:
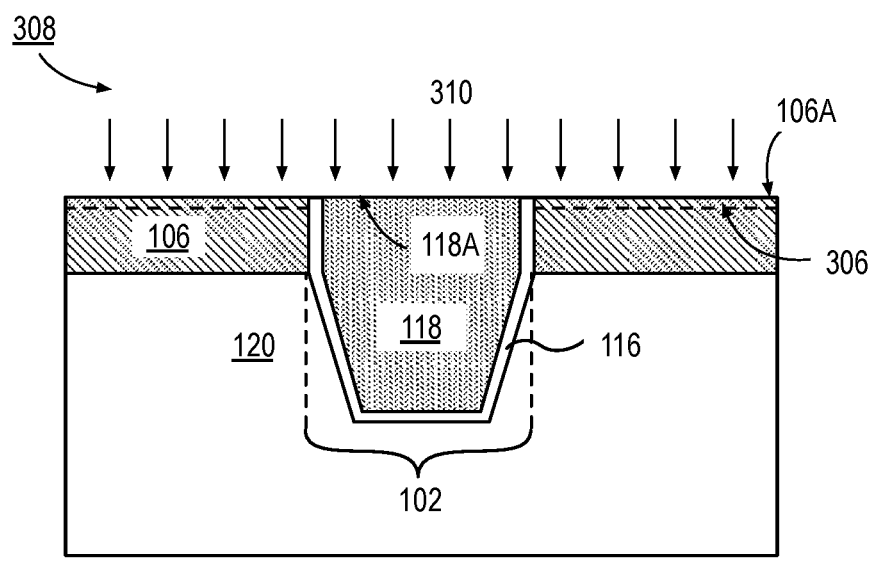
FIG. 3E illustrates a cross-sectional view of the structure of FIG. 3D following the processing of chemical treatment of the second dielectric to reduce the carbon content and to prepare the first wafer for mechanical bonding.

FIG. 3E illustrates a cross-sectional view of the structure of FIG. 3D following the processing of chemical treatment of a wafer 308 including the interconnect 102 and dielectric 106. In an embodiment, the chemical treatment includes a wet chemical reaction and is performed as part of the planarization process. The wet chemical process may involve [treatment of a wafer 308 with chemistries which activate the dielectric surface 106A. Activation of the dielectric surface 106A may be achieved by a variety of chemical methods and is characterized by an increase in bonding energy between dielectric surface 106A and a compatible dielectric surface of another wafer. One method of activation may be to lower the carbon content of 106A. Another approach may be to modify the dielectric surface 106A with functional groups that have a strong binding energy with a dielectric surface on an uppermost portion of the wafer to be bonded to wafer 308.

In an embodiment, the chemical treatment includes plasma activation (denoted by arrows 310) of the dielectric surface 106A. The plasma activation process reduces the carbon content in an upper most portion (above dashed line 306) of the dielectric 106. The reduction in carbon enables bonding between the dielectric 106 and a dielectric surface of another wafer. The carbon content in the dielectric 106 may be reduced at the dielectric surface 106A to less than 0.05%. By reducing the carbon content, the surface is made to be more hydrophilic, and additional adsorbed water increases the interfacial adhesion of the dielectrics. The increased silicon and oxygen content of the surface increases the final bond strength of the dielectric by increasing the density of covalent bonds between the surfaces. In an embodiment, the region above the dashed line has a vertical thickness (in Z-direction) that is approximately 1 nm or less. In other embodiments, the dashed line coincides within monolayers of the dielectric surface 106A.

The plasma activation does not materially impact the fill metal 118 or the adhesion layer 116.

Figure 3F:
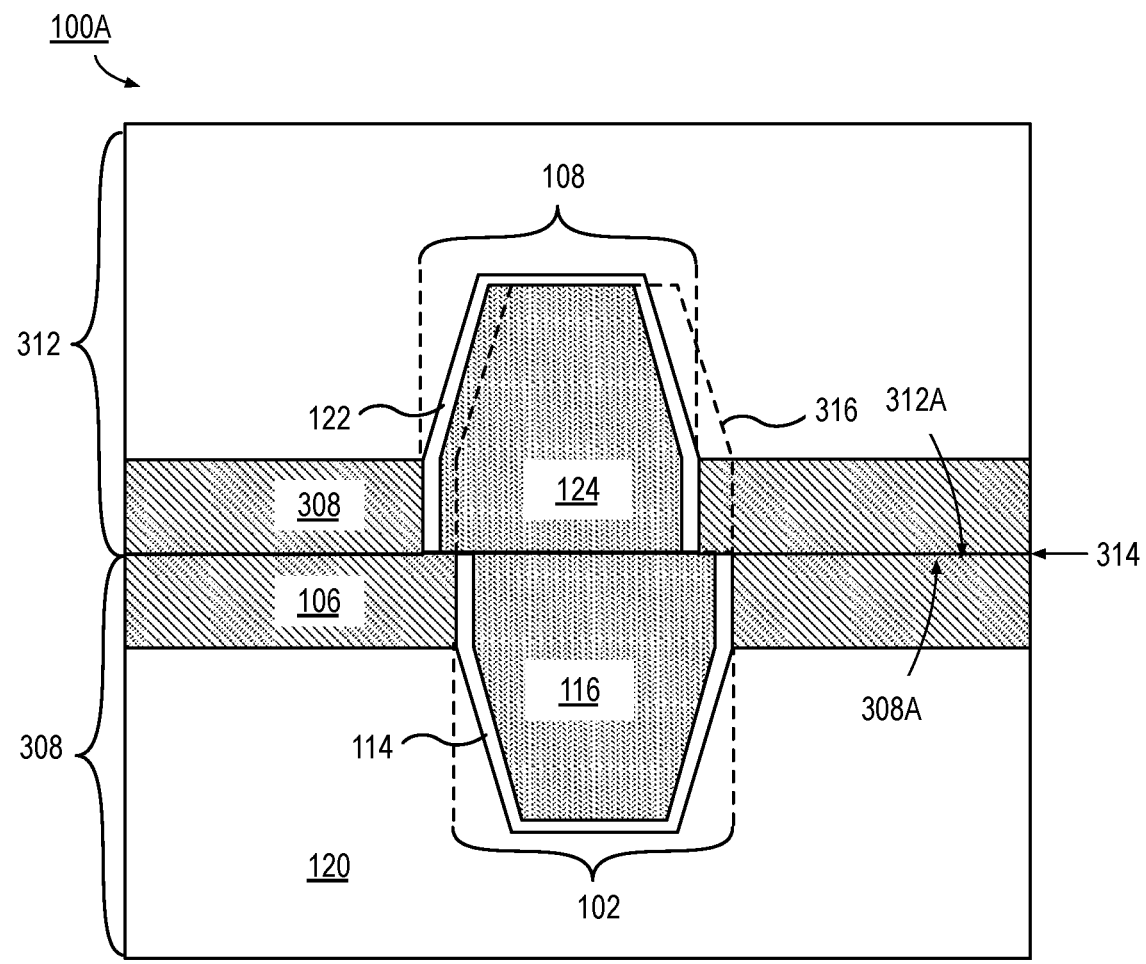
FIG. 3F illustrates a cross-sectional view of the structure of FIG. 3E following the process to bond a second wafer substantially similar to first wafer with the first wafer to form an integrated circuit interconnect structure, in accordance with an embodiment of the present disclosure.

FIG. 3F illustrates a cross-sectional view of the structure of FIG. 3E following the process to bond a wafer 312 substantially similar to a wafer 308 with the wafer 308 to form an integrated circuit interconnect structure 100A, in accordance with an embodiment of the present disclosure. In an embodiment, wafer 312 includes the interconnect 108 having the adhesion layer 122 and the fill metal 124 descried above. The bonding process involves aligning the structure of the interconnect 102 with the structure of the interconnect 108. In the illustrative embodiment, the interconnect 108 is slightly misaligned with the interconnect 102 without adversely impacting an electrical performance of the integrated circuit interconnect structure 100A. The amount of misalignment is in the level described above in association with FIG. 1A. Referring again to FIG. 3F, dashed line 316 indicates and embodiment where the interconnect 108 is substantially aligned with interconnect 102.

Topography at a bond interface 314 between wafer surface 308A of wafer 308 and wafer surface 308A of wafer 312 may result in voiding. Voids are a source of reliability concern for integrated circuits. The number and size of voids is dependent on variation in topography of surfaces 308A and 312A, material properties of the substrates 308 and 312, and adhesion energy of the substrates 308 and 312. Increasing the adhesion energy of the bonded, but unannealed substrates 308 and 312 may reduce the number and size of voids. Plasma activation, described above, is one method that may increase the adhesion energy and decrease voiding by changing surface composition at bond interface 314.

In other embodiments an interconnect is formed in a single dielectric for the ease of planarization. A dielectric that has properties of acting as a copper diffusion barrier are inserted at a later operation.

Figure 4A:
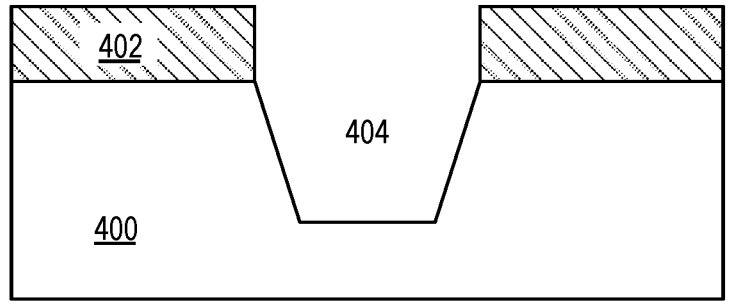
FIG. 4A illustrates a cross-sectional view an opening formed in a first dielectric above a substrate of a first wafer.

FIG. 4A illustrates a cross-sectional view an opening formed in a dielectric 400 above a substrate. The dielectric 400 includes a material substantially similar to the material of the dielectric 120. In an exemplary embodiment, dielectric includes no carbon. A mask 402 is lithographically patterned and utilized to form an opening 404 in the dielectric 400. In an embodiment, a plasma etch process is utilized.

Figure 4B:
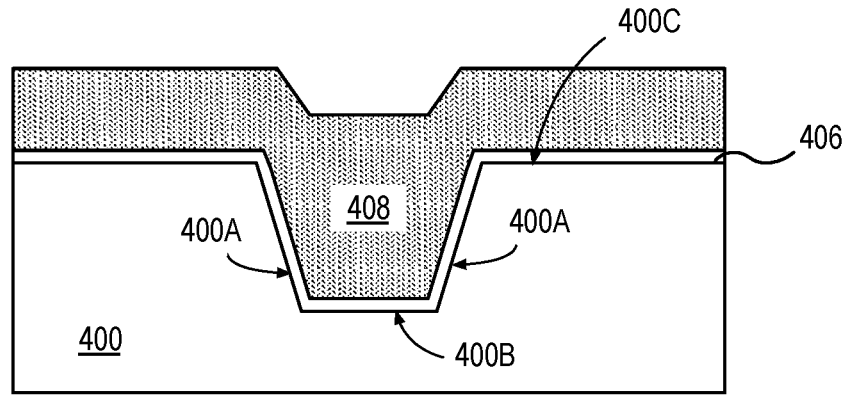
FIG. 4B illustrates cross-sectional view of the structure in FIG. 4A following a process to deposit a conductive material in the opening.

FIG. 4B illustrates cross-sectional view of the structure in FIG. 4A following a process to deposit a conductive material in the opening 404. In an embodiment, the deposition process includes blanket depositing an adhesion layer 406 in the opening 404 on the sidewalls 400A, on the surface 400B, and uppermost surface 400C of the dielectric 400. The adhesion layer 406 may be deposited to a thickness between 1 nm and 3 nm. In an embodiment, the adhesion layer 406 includes ruthenium or tantalum and adheres to the dielectric 400. In an embodiment, the deposition process may include a physical vapor deposition (PVD), CVD or atomic layer deposition (ALD) process. The deposition process is continued with the blanket deposition of a fill metal layer 408 on the adhesion layer 406. In an embodiment, the fill metal layer includes tungsten, cobalt, nickel, or copper. The deposition process may include a physical vapor deposition (PVD), CVD, atomic layer deposition (ALD) or an electrochemical deposition process.

Figure 4C:
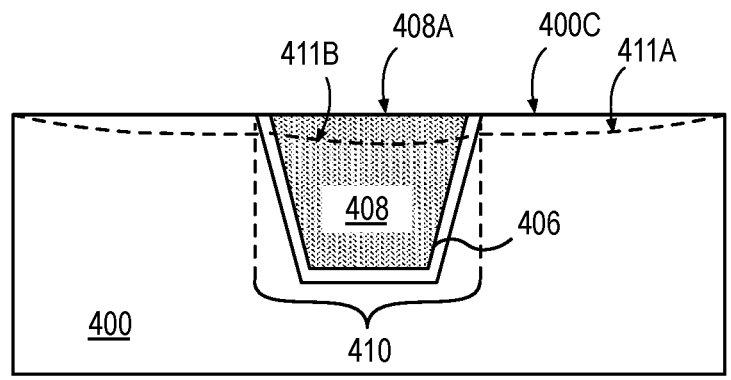
FIG. 4C illustrates the structure of FIG. 4B following the process of forming an interconnect in the opening adjacent to the first dielectric.

FIG. 4C illustrates the structure of FIG. 4B following the process of forming an interconnect 102. In an embodiment, a planarization process such as a chemical mechanical polish (CMP) process is carried out to form the interconnect 410. In an embodiment, the CMP process removes the excess fill metal layer 408 above the dielectric surface 400C. The CMP process may be continued until the adhesion layer 406 is removed from above the dielectric surface 400C. In an embodiment, an upper portion of the dielectric 400 is also removed by the CMP process.

In an embodiment, the CMP process leaves an uppermost dielectric surface 400C that is co-planar or substantially co-planar with an uppermost surface 408A of the fill metal 408 and an uppermost portion of the adhesion layer 406 as shown.

In other embodiments the dielectric 400 is partially concave because of dishing during the CMP process as indicated by dashed line 411A. The dishing may be caused by the lack of carbon in the dielectric 400. The fill metal may also have a concave profile as indicated by dashed line 411B. The amount of dishing of the dielectric 400 may be different from the amount of dishing of the fill metal 408 as indicated by the differences in the shapes of the dashed lines 410 and 411. The amount of dishing may be more prominent in the dielectric than in the fill metal 408.

Figure 4D:
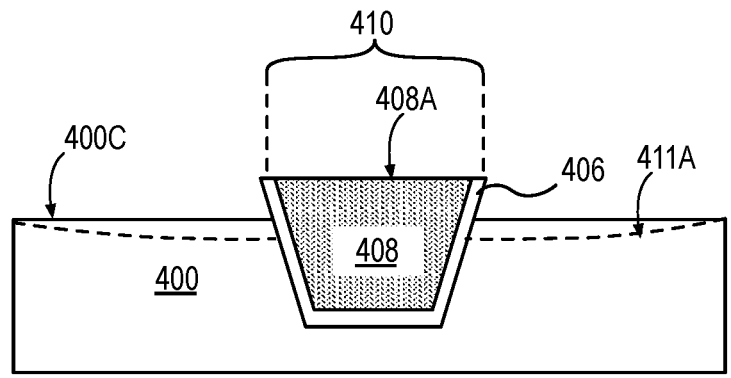
FIG. 4D illustrates a cross-sectional view of the structure of FIG. 4C following a process to recess an uppermost surface of the first dielectric below an uppermost surface of the interconnect.

FIG. 4D illustrates a cross-sectional view of the structure of FIG. 4C following a process to recess the uppermost dielectric surface 400C below an uppermost surface 408A of the fill metal 408 and below an uppermost portion of the adhesion layer 406. In an embodiment, a wet chemical process is utilized to recess the dielectric 400. In an embodiment, the dielectric 400 is recess between 5 nm and 20 nm below the uppermost surface 408A. When the uppermost dielectric surface 400C is concaved as illustrated in the Figure, the wet chemical process does not appreciably alter the topography of the uppermost dielectric surface 400C as indicated by the dashed line 411A post recessing of the dielectric 400. The process utilized to recess the dielectric 400 is selective to the adhesion layer 406 and the fill metal 408. Sidewall portions of the adhesion layer are exposed after recessing the dielectric 400.

Figure 4E:
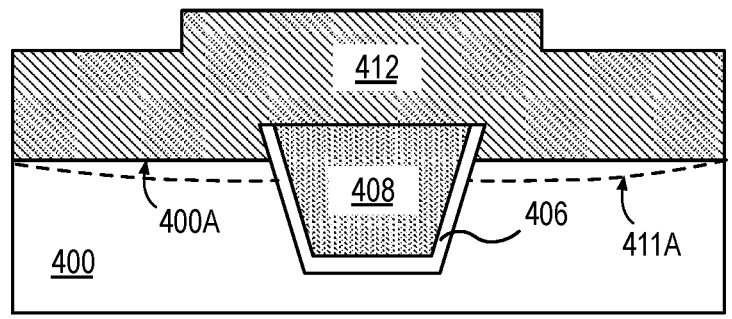
FIG. 4E illustrates a cross-sectional view of the structure of FIG. 4D following the formation of a second dielectric on the recessed uppermost surface of the first dielectric and on upper most portions and sidewalls of the interconnect.

FIG. 4E illustrates a cross-sectional view of the structure of FIG. 4D following the formation of a dielectric 412 on the recessed dielectric surface 400C, on upper most portions of the adhesion layer 406 and on the uppermost surface 408A of the fill metal 408. The dielectric 412 includes a material that is the same or substantially the same as the material of the dielectric 106. In an exemplary embodiment, dielectric 412 includes silicon, carbon and at least one or more of oxygen and nitrogen.

Figure 4F:
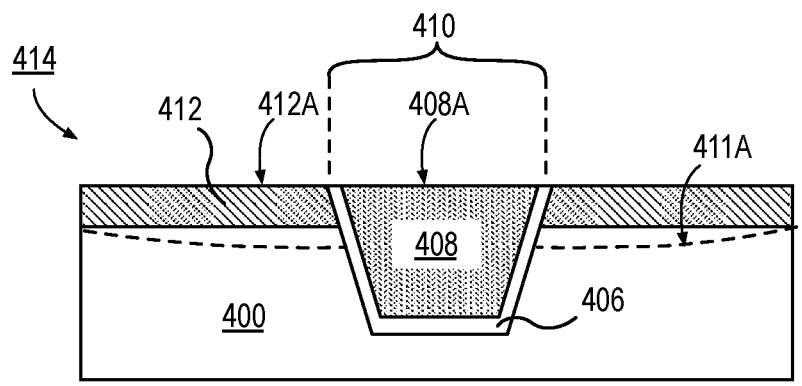
FIG. 4F illustrates a cross-sectional view of the structure of FIG. 4E, following the process of planarizing the second dielectric and portions of the interconnect to form substantially co-planar uppermost surfaces of the second dielectric and the interconnect.

FIG. 4F illustrates a cross-sectional view of the structure of FIG. 4E, following the process of planarizing the dielectric 412 and portions of the fill metal 408 and adhesion layer 406. In an embodiment, a CMP process is utilized to planarize and remove the dielectric from above the fill metal 408 and the adhesion layer 406. The CMP process is extended until upper portions of the dielectric 412, fill metal 408 and adhesion layer 406 are also removed. In the illustrative embodiment, the CMP process forms an uppermost dielectric surface 412A that is substantially co-planar with the uppermost surface 408A and upper portion of adhesion layer 406. It is to be appreciated that in some embodiments, because of the dishing of the lowermost surface of the dielectric 400, (indicated by dashed line 411A) the dielectric 412 is nonplanar. In some such embodiments, the dielectric 412 which includes carbon has a vertical thickness that varies laterally away from the interconnect. After planarization wafer 414 including the interconnect 410 and the dielectric 412 on dielectric 400 undergoes a chemical treatment that is described above in connection with FIG. 3E and prepared for bonding with another wafer that is prepared similarly to wafer 414.

Figure 4G:
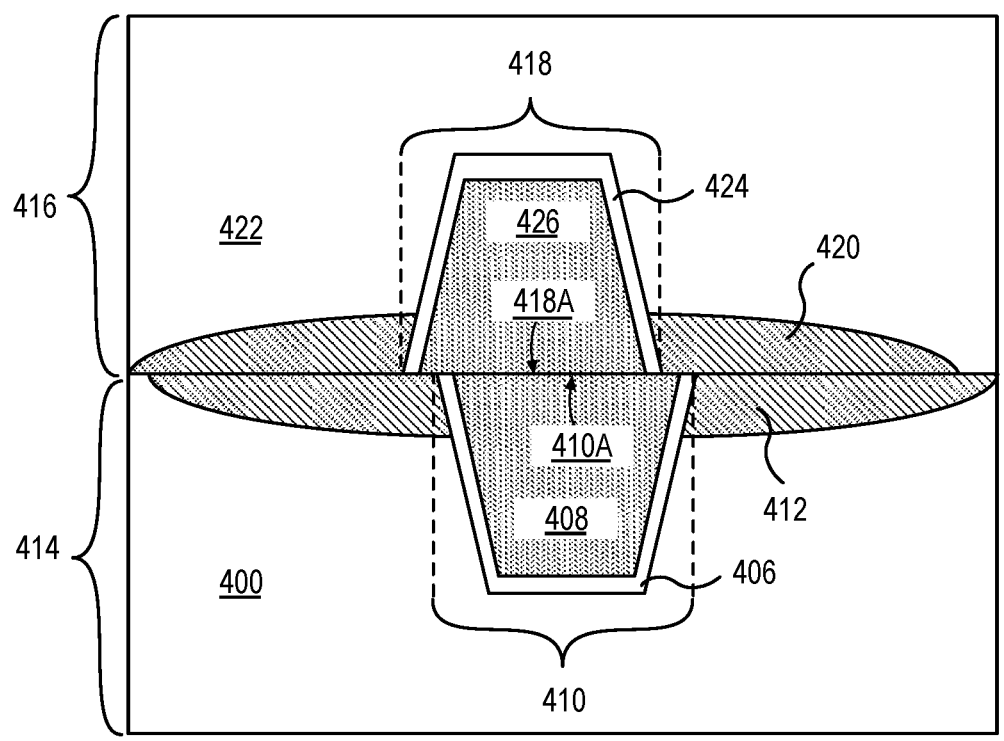
FIG. 4G illustrates a cross-sectional view of the structure of FIG. 4F following the process to bond a second wafer substantially similar to first wafer with the first wafer to form an integrated circuit interconnect structure, in accordance with an embodiment of the present disclosure.

FIG. 4G is a cross-sectional view of a wafer 416 bonded to the wafer 414, in accordance with an embodiment of the present disclosure. In an embodiment, the wafer 416 is prepared substantially identically to wafer 414 and includes one or more features of the wafer 414. In an embodiment, wafer 416 includes an interconnect 418 adjacent to a dielectric 420. The dielectric 420 includes a material that is the same or substantially the same as the material of the dielectric 412. In the illustrative embodiment, dielectric 420 has a partially concaved profile and is in contact with a dielectric 422 above. As shown, the interconnect 418 includes an adhesion layer 424 and a fill metal 426.

In the illustrative embodiment, an axial center of interconnect 418 is misaligned with an axial center of the interconnect 410. In some such embodiment, a portion of an uppermost surface 410A of the interconnect 410 is in contact with the dielectric 420 and portions of a lowermost surface 418A of the interconnect 418 is in contact with the dielectric 412. In other embodiments axial center of interconnect 410 and axial center of interconnect 418 are substantially aligned.

While methods for two different wafer combinations have been discussed above. Other wafer combinations depicting the structures described in association with FIGS. 1C-1F may be fabricated in a similar manner.

Figure 5:
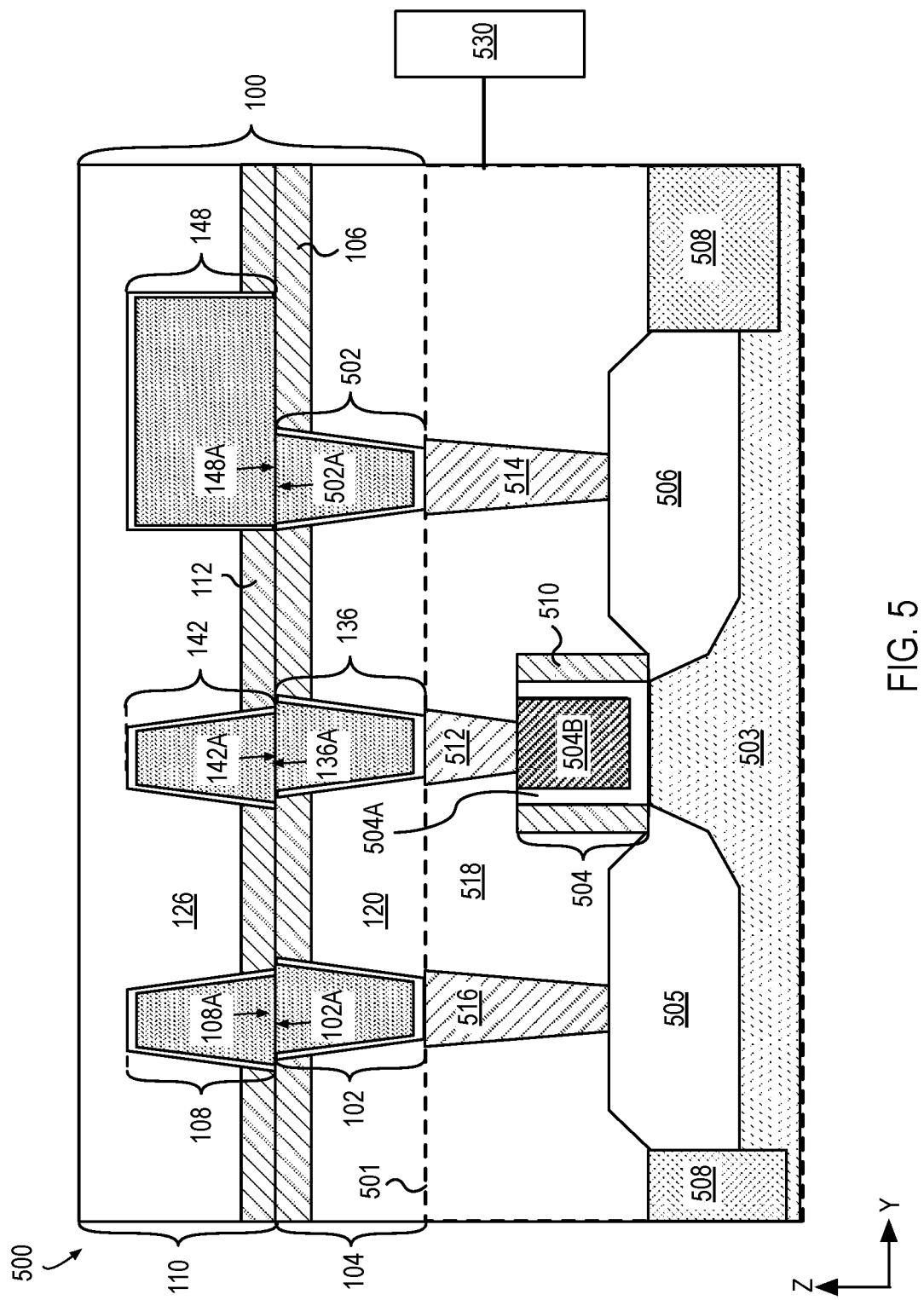
FIG. 5 illustrates a cross-sectional view of an integrated circuit structure coupled with a transistor.

FIG. 5 illustrates a cross-sectional view of a system 500 including an integrated circuit interconnect structure 501A coupled with a MOS transistor 501B, in accordance with an embodiment of the present disclosure. In an embodiment, the integrated circuit interconnect structure 501A has one or more structural and material properties described above in association the integrated circuit interconnect structure 100A, 100B, 100C and illustrated in FIG. 1A. Referring again to FIG. 5, the integrated circuit interconnect structure 501A includes an interconnect 102 in a metallization level 104 and a dielectric 106 adjacent to at least a portion of the interconnect 102, where the dielectric 106 has a first carbon content. The metallization level 104 further includes an interconnect 136 adjacent to the dielectric 106 and spatially distant from the interconnect 102 and an interconnect 502 adjacent to the dielectric 106 and spatially distant from the interconnect 136.

The integrated circuit interconnect structure 501A further includes an interconnect 108 in a metallization level 110 above the metallization level 104. The interconnect 108 includes a lowermost surface 108A in contact with at least a portion of an uppermost surface 102A of the interconnect 102. A dielectric 112 is adjacent to at least a portion of the interconnect 108 and directly adjacent to the dielectric 106, where the dielectric 112 has a second carbon content. The metallization level 110 further includes an interconnect 142 adjacent to the dielectric 112 and spatially distant from the interconnect 108 and an interconnect line segment 148 adjacent to the dielectric 112 and spatially distant from the interconnect 142.

The lowermost interconnect surface 142A is in contact with at least a portion of an uppermost interconnect surface 136A. As shown the interconnect line segment 148 has a lowermost interconnect line segment surface 148A is in contact with an uppermost surface 502A of the interconnect 502. In an embodiment, interconnect 502 has one or more properties of the interconnect 102, such as properties described in association with FIG. 1A.

In the illustrative embodiment, the metallization level 104 further includes dielectric 120 adjacent to the interconnects 102, 136 and 502 and the metallization level 110 further includes dielectric 126 adjacent to the interconnects 108, 142 and interconnect line segment 502.

Referring again to FIG. 5, in an embodiment, the transistor 501B is on a substrate 503 and has a gate 504, a source region 505, and a drain region 506. In the illustrative embodiment, an isolation 508 is adjacent to the source region 505, drain region 506 and portions of the substrate 503. In some implementations of the disclosure, such as is shown, a pair of sidewall spacers 510 are on opposing sides of the gate 504.

The transistor 501B further includes a gate contact 512 above and electrically coupled to the gate 504, and a drain contact 514 above and electrically coupled to the drain region 506, and a source contact 516 above and electrically coupled to the source region 505, as is illustrated in FIG. 5. The transistor 501B also includes dielectric 518 adjacent to the gate 504, source region 505, drain region 506, isolation 508, sidewall spacers 510, gate contact 512, contact 514 and contact 516.

In the illustrative embodiment, the metallization level 104 is directly above contacts 512, 514 and 516, where the dielectric 120 is directly above and in contact with dielectric 518. As shown, the interconnect 102 is directly on and in contact with the contact 516, interconnect 136 is directly on and in contact with the contact 512, and interconnect 502 is directly on and in contact with the contact 514. In some embodiments, the dielectric 120 is also in contact with uppermost surface portions of contacts 512, 514 and/or 516.

In some embodiments, there are one or more additional metallization levels between metallization level 104 and the transistor 501B.

In an embodiment, the underlying substrate 503 represents a surface used to manufacture integrated circuits. Suitable substrate 503 includes a material such as single crystal silicon, polycrystalline silicon and silicon on insulator (SOI), as well as substrates formed of other semiconductor materials. In some embodiments, the substrate 503 is the same as or substantially the same as the substrate 101. The substrate 503 may also include semiconductor materials, metals, dielectrics, dopants, and other materials commonly found in semiconductor substrates.

In an embodiment, the transistor 501B associated with substrate 503 are metal-oxide-semiconductor field-effect transistors (MOSFET or simply MOS transistors), fabricated on the substrate 503. In some embodiments, the transistor 501B is an access transistor 501B. In various implementations of the disclosure, the transistor 501B may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In some embodiments, gate 504 includes at least two layers, a gate dielectric layer 504A and a gate electrode 504B. The gate dielectric layer 504A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 504A to improve its quality when a high-k material is used.

The gate electrode 504B of the access transistor 501B of substrate 503 is formed on the gate dielectric layer 504A and may consist of at least one P-type work function metal or N-type work function metal, depending on whether the transistor is to be a PMOS or an NMOS transistor. In some implementations, the gate electrode 504B may consist of a stack of two or more metal layers, where one or more metal layers are work function metal layers and at least one metal layer is a conductive fill layer.

For a PMOS transistor, metals that may be used for the gate electrode 504B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 504B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 504B may consist of one or more U-shaped metal layers formed atop one or more planar, non-U-shaped layers.

The sidewall spacers 510 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 505 and drain region 506 are formed within the substrate adjacent to the gate stack of each MOS transistor. The source region 505 and drain region 506 are generally formed using either an implantation/diffusion process or an etching/deposition process. In the former process, dopants such as boron, aluminum, antimony, phosphorous, or arsenic may be ion-implanted into the substrate to form the source region 505 and drain region 506. An annealing process that activates the dopants and causes them to diffuse further into the substrate typically follows the ion implantation process. In the latter process, the substrate 503 may first be etched to form recesses at the locations of the source and drain regions. An epitaxial deposition process may then be carried out to fill the recesses with material that is used to fabricate the source region 505 and drain region 506. In some implementations, the source region 505 and drain region 506 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 505 and drain region 506 may be formed using one or more alternate semiconductor materials such as germanium or a group III-V material or alloy. And in further embodiments, one or more layers of metal and/or metal alloys may be used to form the source region 505 and drain region 506.

In an embodiment, the source contact 516, the drain contact 514 and gate contact 512 each include a liner layer and fill metal. In an embodiment, the liner layer incudes Ti, Ru or Al and a conductive cap on the liner layer. The conductive cap may include a material such as W, Co or Cu.

The isolation 508 and dielectric 518 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

In the illustrative embodiment, the system 500 further includes a battery 530 coupled to power the radio transceiver.

Figure 6:
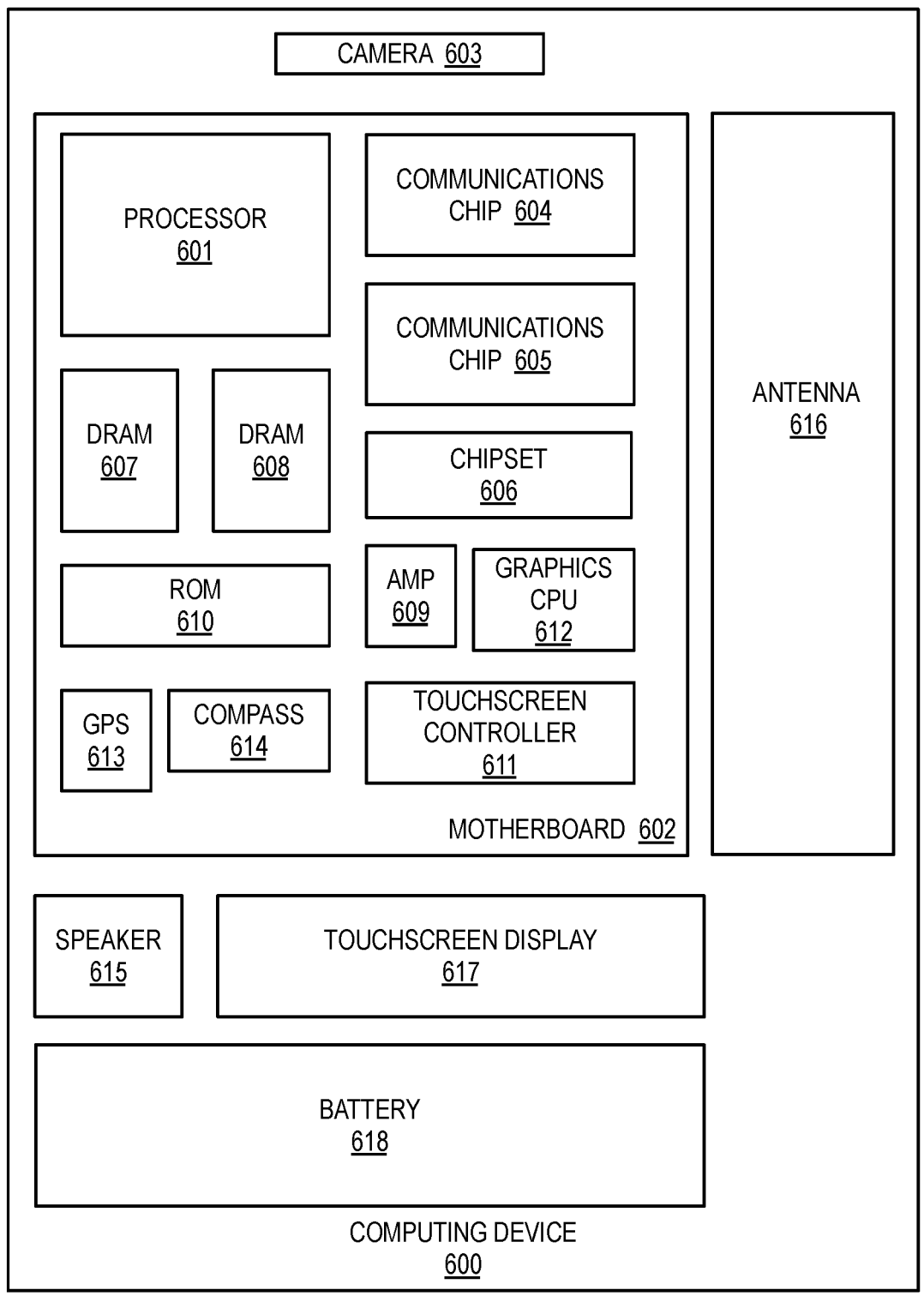
FIG. 6 illustrates a computing device in accordance with embodiments of the present disclosure.

FIG. 6 illustrates a computing device 600 in accordance with embodiments of the present disclosure. As shown, computing device 600 houses a motherboard 602. Motherboard 602 may include a number of components, including but not limited to a processor 601 and at least one communications chip 604 or 605. Processor 601 is physically and electrically coupled to the motherboard 602. In some implementations, communications chip 605 is also physically and electrically coupled to motherboard 602. In further implementations, communications chip 605 is part of processor 601.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset 606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Communications chip 605 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 605 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communications chips 604 and 605. For instance, a first communications chip 605 may be dedicated to shorter range wireless communications such as Wi-Fi and Bluetooth and a second communications chip 604 may be dedicated to longer range wireless communications such as GPS, EDGE, GPRS, CDMA, WiMAX, LTE, Ev-DO, and others.

Processor 601 of the computing device 600 includes an integrated circuit die packaged within processor 601. In some embodiments, the integrated circuit die of processor 601 includes one or more transistors such as MOS transistors 501B coupled with integrated circuit interconnect structure 501A (described in association with FIG. 5), interconnect structures, and non-volatile memory (NVM) devices such as magnetic tunnel junction and resistive random-access memory devices. The term "processor" may refer to any device or portion of a device that processes electronic data from registers and/or memory to transform that electronic data into other electronic data that may be stored in registers and/or memory.

Communications chip 605 also includes an integrated circuit die packaged within communication chip 605. In another embodiment, the integrated circuit die of communications chips 604, 605 includes one or more transistors, interconnect structures such as integrated circuit interconnect structure (described in association with FIGS. 1A-1E), and non-volatile memory devices such as magnetic tunnel junction and resistive random-access memory devices. Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics CPU 612, flash memory, global positioning system (GPS) device 613, compass 614, a chipset 606, an antenna 616, a power amplifier 609, a touchscreen controller 611, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 600 and discussed above may contain a stand-alone integrated circuit memory die that includes one or more arrays of NVM devices coupled with a transistor connected to external circuitry by one or more interconnect structures such as integrated circuit interconnect structure (described in association with FIGS. 1A-1F). In an embodiment, the NVM devices may include spintronics based devices, magnetic tunnel junction devices, resistive random-access devices. In other embodiments two or three terminal spin orbit torque memory devices may be coupled with one or more transistors.

In various implementations, the computing device 600 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Accordingly, one or more embodiments of the present disclosure may relate generally to the fabrication of integrated circuit interconnect structure for logic and embedded memory.

In a first example, an integrated circuit interconnect structure includes a first interconnect in a first metallization level and a first dielectric adjacent to at least a portion of the first interconnect, where the first dielectric having a first carbon content. The integrated circuit interconnect structure further includes a second interconnect in a second metallization level above the first metallization level. The second interconnect includes a lowermost surface in contact with at least a portion of an uppermost surface of the first interconnect. A second dielectric having a second carbon content is adjacent to at least a portion of the second interconnect and the first dielectric. The first carbon concentration increases with distance away from the lowermost surface of the second interconnect and the second carbon concentration increases with distance away from the uppermost surface of the first interconnect.

In second examples, for any of first examples, the first dielectric includes silicon and least one or more of oxygen and nitrogen and the second dielectric includes silicon and oxygen and doped with one or more of nitrogen or carbon.

In third examples, for any of the first through second examples, the first carbon content is between 2% and 30% of the first dielectric and where the second carbon content is between 2% and 30% of the second dielectric.

In fourth examples, for any of the first through third examples, the first dielectric and the second dielectric include a same material.

In fifth examples, for any of the first through fourth examples, the first dielectric includes a vertical thickness between 2 nm and 20 nm and the second dielectric includes a vertical thickness between 2 nm and 20 nm, where the combined vertical thickness of the first dielectric and the second dielectric varies by at least 5% away from the first interconnect or second interconnect.

In sixth examples, for any of the first through fifth examples, the region including the interface between the first dielectric and the second dielectric has a vertical thickness of at most 1 nm.

In seventh examples, for any of the first through sixth examples, the second dielectric is on a portion of the uppermost surface of the first interconnect and where a lowermost surface of the second interconnect is on a portion of the first dielectric.

In eighth examples, for any of the first through seventh examples, the first interconnect includes a wide upper portion and a narrow lower portion, where the second interconnect includes a narrow upper portion and wide lower portion and where the wider upper portion of the first interconnect is in contact with the wider lower portion of the second interconnect.

In ninth examples, for any of the first through eighth examples, the integrated circuit interconnect structure further includes a third dielectric adjacent to the first interconnect and below the first dielectric, where the third dielectric includes a material with less carbon content than the first dielectric. The integrated circuit interconnect structure further includes a fourth dielectric adjacent to the second interconnect and above the second dielectric where the fourth dielectric includes a material with less carbon content than the second dielectric.

In tenth examples, for any of the first through ninth examples, the interface between first dielectric and the third dielectric is nonplanar and where the interface between second dielectric and the fourth dielectric is nonplanar.

In eleventh examples, for any of the first through tenth examples, the integrated circuit interconnect structure further includes a fifth dielectric between the first dielectric and the third dielectric and adjacent to the first interconnect, where the fifth dielectric includes no carbon. The integrated circuit interconnect structure further includes a sixth dielectric between the second dielectric and the fourth dielectric and adjacent to the second interconnect, where the sixth dielectric includes no carbon.

In twelfth examples, for any of the first through eleventh examples, the first metallization level further includes a third interconnect adjacent to the first dielectric and spatially distant from the first interconnect and where the third interconnect has an uppermost surface that is substantially coplanar with the uppermost surface of the first interconnect.

In thirteenth examples, for any of the first through twelfth examples, the second metallization level further includes a fourth interconnect adjacent to the second dielectric and spatially distant from the second interconnect, where the fourth interconnect has a lowermost surface that is substantially coplanar with the lowermost surface of the second interconnect, and where the uppermost surface of the third interconnect is in contact with a portion of the lowermost surface of the fourth interconnect.

In a fourteenth example, for any of the first through thirteenth examples, the third interconnect is spatially distant from the first interconnect by an amount that is substantially equal to an amount the third interconnect is spatially distant from the second interconnect.

In fifteenth examples, for any of the first through fourteenth examples, the first interconnect is a via or an interconnect line segment and the second interconnect is a via or an interconnect line segment.

In sixteenth examples, for any of the first through fifteenth examples, the second interconnect is an interconnect line segment and where uppermost surfaces of the first interconnect and the third interconnect are directly adjacent to and in contact with a lowermost surface of the interconnect line segment.

In seventeenth examples, a method of fabricating an integrated circuit interconnect structure includes preparing a first substrate, where the preparing includes forming a first material layer stack including a first dielectric and a second dielectric including carbon on the first dielectric. The method further includes forming an opening in the first material layer stack, depositing a first conductive material in the opening and planarizing the first conductive material and an upper portion of the second dielectric to form a first interconnect. The method further includes chemically treating the second dielectric, and preparing a second substrate, where the preparing includes forming a second material layer stack including a third dielectric and a fourth dielectric including carbon on the third dielectric. The method further includes forming an opening in the second material layer stack, depositing a second conductive material in the opening and planarizing the second conductive material and an upper portion of the fourth dielectric to form a second interconnect and chemically treating the fourth dielectric. The method further includes bonding the first substrate with the second substrate by spatially aligning the first interconnect with the second interconnect and bringing into contact the uppermost surface of the first interconnect and the uppermost surface of the second interconnect.

In eighteenth examples, for any of the seventeenth example, chemically treating the second dielectric and the fourth dielectric including reducing the carbon content of uppermost portions of each of the second dielectric and the fourth dielectric.

In nineteenth examples, for any of the seventeenth through eighteenth examples, planarizing the first conductive material and an upper portion of the second dielectric forms a first interconnect with an uppermost surface that is substantially coplanar with an uppermost surface of the second dielectric, and where planarizing the second conductive material and an upper portion of the fourth dielectric forms a second interconnect with an uppermost surface that is substantially coplanar with an uppermost surface of the fourth dielectric.

In twentieth example, a system includes a processor, a radio transceiver coupled to the processor, where the transceiver includes a transistor. The transistor includes a drain contact coupled to a drain, a source contact coupled to a source and a gate contact coupled to a gate. The system further includes an integrated circuit interconnect structure coupled with the drain contact. The integrated circuit interconnect structure includes a first interconnect in a first metallization level directly adjacent to the drain contact and a first dielectric adjacent to at least a portion of the first interconnect, where the first dielectric having a first carbon content. The integrated circuit interconnect structure further includes a second interconnect in a second metallization level above the first metallization level. The second interconnect includes a lowermost surface in contact with at least a portion of an uppermost surface of the first interconnect. A second dielectric having a second carbon content is adjacent to at least a portion of the second interconnect and the first dielectric. The first carbon concentration increases with distance away from the lowermost surface of the second interconnect and the second carbon concentration increases with distance away from the uppermost surface of the first interconnect.

In twenty-first examples, for any of the twentieth example, the system of further includes a battery coupled to power at least one of the processor or radio transceiver.

What is claimed is:

1. An integrated circuit (IC) interconnect structure, comprising:
   a first dielectric material layer adjacent to at least a portion of a first interconnect feature;
   a second interconnect feature in contact with at least a portion of the first interconnect feature;
   a second dielectric material layer adjacent to at least a portion of the second interconnect feature;
   a third dielectric material layer between the first and second dielectric material layers, wherein the third dielectric material layer is adjacent to the first interconnect feature and in contact with a portion of the second interconnect feature, and wherein the third dielectric material layer has a greater nitrogen content than at least the first dielectric material layer and wherein the third dielectric material layer comprises carbon; and
   a fourth dielectric material layer between the second and third dielectric material layers, wherein the fourth dielectric material layer is adjacent to the second interconnect feature and in contact with a portion of the first interconnect feature, wherein the fourth dielectric material layer has a greater nitrogen content than at least the second dielectric material layer, and wherein the fourth dielectric material layer comprises carbon, and wherein carbon content within the third dielectric material layer decreases with proximity to the fourth dielectric material layer and wherein carbon content within the fourth dielectric material layer decreases with proximity to the third dielectric material layer.

2. The IC interconnect structure of claim 1, wherein the third dielectric material layer further comprises silicon, and oxygen.

3. The IC interconnect structure of claim 2, wherein the third or fourth dielectric material layer has a maximum carbon concentration of at least 2 at. %.

4. The IC interconnect structure of claim 2, wherein the first dielectric material layer comprises silicon and oxygen.

5. The IC interconnect structure of claim 1, wherein carbon content in the first and second dielectric material layers is substantially zero.

6. The IC interconnect structure of claim 1, wherein:
   the carbon content within the third dielectric material layer has a minimum less than 0.05 at. %; and
   the carbon content within the fourth dielectric material layer has a minimum less than 0.05 at. %.

7. The IC interconnect structure of claim 1, wherein:
   the third dielectric material layer further comprises silicon, and oxygen; and
   the fourth dielectric material layer further comprises silicon and oxygen.

8. The IC interconnect structure of claim 1, wherein:
   the first dielectric material layer comprises silicon and oxygen; and
   the second dielectric material layer comprises silicon and oxygen.

9. The IC interconnect structure of claim 1, wherein:
   the carbon content within the third dielectric material has a maximum of at least 2 at. %; and
   the carbon content within the fourth dielectric material layer has a maximum of at least 2 at. %.

10. The IC interconnect structure of claim 1, wherein the first interconnect feature comprises a wide upper portion and a narrow lower portion, wherein the second interconnect feature comprises a narrow upper portion and wide lower portion and wherein the wide upper portion of the first interconnect feature is in contact with the wide lower portion of the second interconnect feature.

11. The IC interconnect structure of claim 10, wherein the first interconnect feature is within a first metallization level further comprising a third interconnect feature adjacent to the first dielectric material layer and spatially distant from the first interconnect feature, and wherein the third interconnect feature has an uppermost surface that is substantially coplanar with the uppermost surface of the first interconnect feature.

12. The IC interconnect structure of claim 11, wherein the second interconnect feature is within a second metallization level further comprising a fourth interconnect feature adjacent to the second dielectric material layer and spatially distant from the second interconnect feature, and wherein the fourth interconnect feature has a lowermost surface that is substantially coplanar with the lowermost surface of the second interconnect feature, and wherein the uppermost surface of the third interconnect feature is in contact with a portion of the lowermost surface of the fourth interconnect feature.

13. The IC interconnect structure of claim 12, wherein the third interconnect feature is spatially distant from the first interconnect feature by an amount that is substantially equal to an amount the fourth interconnect feature is spatially distant from the second interconnect feature.

14. A system comprising:
   a processor comprising:
      a transistor comprising:
         a drain contact coupled to a drain;
         a source contact coupled to a source; and
         a gate contact coupled to a gate; and
      an IC interconnect structure coupled with the transistor, wherein the IC interconnect structure comprises:
         a first dielectric material layer adjacent to at least a portion of a first interconnect feature;
         a second interconnect feature in contact with at least a portion of the first interconnect feature;
         a second dielectric material layer adjacent to at least a portion of the second interconnect feature;
         a third dielectric material layer between the first and second dielectric material layers, wherein the third dielectric material layer is adjacent to the first interconnect feature and in contact with a portion of the second interconnect feature, and wherein the third dielectric material layer has a greater nitrogen content than at least the first dielectric material layer and wherein the third dielectric material layer comprises carbon; and
         a fourth dielectric material layer between the second and third dielectric material layers, wherein the fourth dielectric material layer is adjacent to the second interconnect feature and in contact with a portion of the first interconnect feature, wherein the fourth dielectric material layer has a greater nitrogen content than at least the second dielectric material layer, wherein the fourth dielectric material layer comprises carbon, wherein carbon content within the third dielectric material layer decreases with proximity to the second interconnect feature, and wherein carbon content within the fourth dielectric material layer decreases with proximity to the first interconnect feature; and
   a power supply comprising an output coupled to the processor.

15. The system of claim 14, further comprising a battery coupled to an input of the power supply.

16. A method of fabricating an integrated circuit interconnect structure, the method comprising:
preparing a first substrate, the preparing comprising:
forming a material layer stack comprising a first dielectric material layer and a second dielectric material layer on the first dielectric material layer, wherein the second
dielectric material layer comprises more nitrogen than the first dielectric material layer, and further comprises carbon;
forming a first opening in the material layer stack;
depositing a first conductive material in the first opening; and
forming a first interconnect feature by planarizing the first conductive material and an upper portion of the second dielectric material layer to form a first interconnect feature;
preparing a second substrate, the preparing comprising:
forming a second opening in a third dielectric material layer and an underlying fourth dielectric material layer, wherein the third dielectric material layer comprises more nitrogen than the fourth dielectric material layer, and further comprises carbon;
depositing a second conductive material in the second opening;
forming a second interconnect feature by planarizing the second conductive material and an upper portion of the third dielectric material layer;
reducing the carbon content of an uppermost portion of the second and fourth dielectric materials; and
bonding the first substrate with the second substrate by bringing into contact the first interconnect feature and the second interconnect feature.

17. The method of claim 16, wherein:
planarizing the first conductive material and the upper surface of the second dielectric layer forms a first interconnect with an uppermost surface that is substantially coplanar with the upper surface of the second dielectric layer; and
planarizing the second conductive material and the upper surface of the third dielectric material layer forms a second interconnect with an uppermost surface that is substantially coplanar with the upper surface of the third dielectric material layer.

18. The method of claim 16, wherein bonding the first substrate with the second substrate contacts the second dielectric material layer with the third dielectric material layer.

* * * * *